(12) United States Patent
Imai et al.

(10) Patent No.: US 9,682,541 B2
(45) Date of Patent: Jun. 20, 2017

(54) BONDING METHOD

(71) Applicant: Tokyo Ohka Kogyo Co., Ltd., Kawasaki-shi (JP)

(72) Inventors: Hirofumi Imai, Kawasaki (JP); Atsushi Kubo, Kawasaki (JP); Takahiro Yoshioka, Kawasaki (JP); Kimihiro Nakada, Kawasaki (JP); Shigeru Kato, Kawasaki (JP); Yasumasa Iwata, Kawasaki (JP)

(73) Assignee: TOKOY OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/566,062

(22) Filed: Dec. 10, 2014

(65) Prior Publication Data
US 2015/0165741 A1    Jun. 18, 2015

(30) Foreign Application Priority Data

Dec. 13, 2013 (JP) .................................. 2013-258622
Mar. 14, 2014 (JP) .................................. 2014-052697

(51) Int. Cl.
*B32B 37/18* (2006.01)
*B32B 37/00* (2006.01)
(Continued)

(52) U.S. Cl.
CPC ............ *B32B 37/18* (2013.01); *B32B 37/003* (2013.01); *B32B 37/0015* (2013.01); *H01L 21/67092* (2013.01); *B32B 37/1018* (2013.01); *B32B 37/1207* (2013.01); *B32B 39/00* (2013.01); *B32B 2037/1215* (2013.01); *B32B 2309/02* (2013.01); *B32B 2309/12* (2013.01); *B32B 2309/68* (2013.01); *B32B 2457/14* (2013.01);
(Continued)

(58) Field of Classification Search
CPC .............. Y10T 156/10; B32B 37/1018; B32B 2457/14; B32B 2309/68; B32B 37/12; B32B 7/12; B32B 38/0012; B32B 37/1009; H01L 21/6835; H01L 21/304; H01L 21/30625; H01L 21/6838; H01L 2221/68304; H01L 2221/38618; H01L 2221/68327; H01L 2224/8385
See application file for complete search history.

(56) References Cited

U.S. PATENT DOCUMENTS

2002/0083849 A1    7/2002 Ohta et al.
2002/0127821 A1*   9/2002 Ohya .................... C09J 7/00
                                              438/459

(Continued)

FOREIGN PATENT DOCUMENTS

JP    2002-192394    7/2002

*Primary Examiner* — Carson Gross
(74) *Attorney, Agent, or Firm* — Knobbe Martens Olson & Bear LLP

(57) ABSTRACT

A bonding method which includes a pressing step of bonding a substrate and a support plate for supporting the substrate to each other through an adhesive layer and pressing the bonded substrate and support plate using a plate member; and, after the pressing step, a pressure adjusting step of placing the substrate and the support plate bonded to each other through the adhesive layer in an environment having higher pressure than pressure of an environment in which the pressing step is performed.

8 Claims, 4 Drawing Sheets

(51) Int. Cl.
  *H01L 21/67*     (2006.01)
  *B32B 37/10*     (2006.01)
  *H01L 21/683*    (2006.01)
  *B32B 37/12*     (2006.01)
  *B32B 39/00*     (2006.01)

(52) U.S. Cl.
  CPC   *H01L 21/6835* (2013.01); *H01L 2221/68304* (2013.01); *H01L 2221/68327* (2013.01); *Y10T 156/10* (2015.01)

(56)        References Cited

U.S. PATENT DOCUMENTS

2007/0125495 A1*  6/2007  Nakamura .......... B32B 38/1841
                                                    156/382
2009/0120572 A1*  5/2009  Sampica ............ B32B 37/1018
                                                    156/285
2014/0057450 A1*  2/2014  Bourbina ........... H01L 21/6835
                                                    438/759

* cited by examiner

FIG. 1D
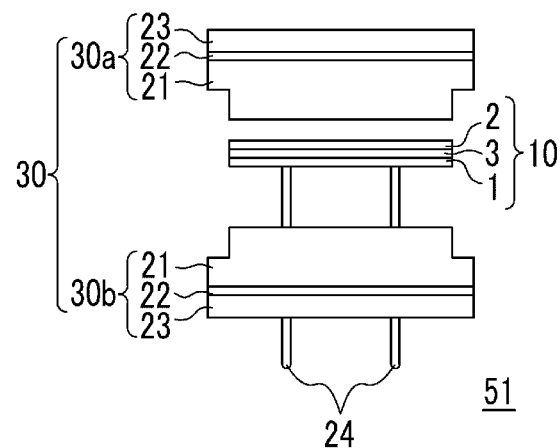
FIG. 1E
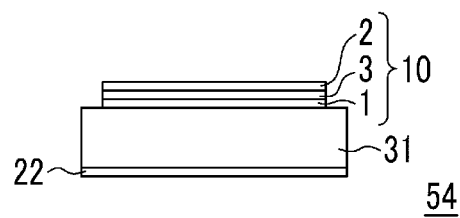
FIG. 1F
FIG. 1G
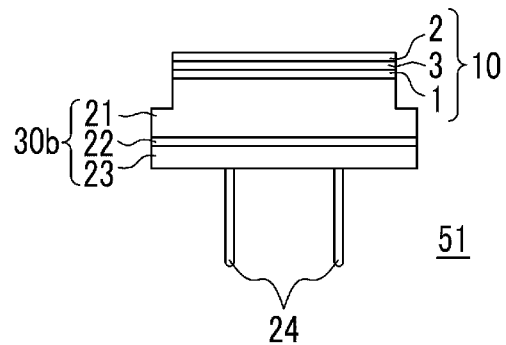

BONDING METHOD

CROSS-REFERENCE TO RELATED APPLICATIONS

Priority is claimed on Japanese Patent Application No. 2013-258622, filed Dec. 13, 2013, and Japanese Patent Application No. 2014-052697, filed Mar. 14, 2014, the content of which are incorporated herein by reference.

BACKGROUND OF THE INVENTION

Field of the Invention

The present invention relates to a bonding method.

Background Art

In recent years, products such as a mobile telephone, digital AV equipment, an IC card, and the like have been improved to have more sophisticated functions. This gives rise to an increase in the demand that semiconductor silicon chips (hereinafter, referred to as chips) provided in the products are downsized and thinned so that chips can be provided with higher density in a package. For example, for an integrated circuit in which a plurality of chips are provided in one package, such as a CSP (chip size package) or an MCP (multi-chip package), there is a demand that the chips be further thinned. In order to provide the chips with higher density in the package, it is necessary to thin the chips to a thickness in a range of 25 μm to 150 μm.

By a grinding process, semiconductor wafers (hereinafter, referred to as wafers) which serve as bases for the respective chips are thinned. However, this weakens the strength, and cracks or warpages are likely to be formed. In addition, the wafers weakened in strength through the thinning are difficult to be transported automatically and need to be transported manually. As can be understood from this, handling of the wafers is troublesome.

As a countermeasure, a wafer handling system is developed which adds strengths to the wafers. According to the wafer handling system, a plate called a support plate, which is made from glass, silicon, or hard plastic, or the like, is bonded to the wafers to be thinned so that the wafers are prevented from being cracked or warped.

Because the strength of the wafers can be secured by the wafer handling system, it is possible to automatically transport the wafers after the thinning process.

In the wafer handling system, the wafers and the support plate are bonded to each other by use of an adhesive tape, a thermoplastic resin, an adhesive composition, or the like. Then, the wafers to which the support plate is bonded are thinned. After this, the support plate is peeled off from a substrate before the wafers are diced. Specifically, in a case where the wafer and the support plate are bonded to each other with the use of the adhesive, the wafers are peeled off from the support plate by dissolving the adhesive.

JP-A-2002-192394 (publication date: Jul. 10, 2002) discloses a pressing method of inorganic substrates in which a set combined with a laminate material including an inorganic substrate formed of semiconductors or ceramics and an auxiliary material for laminating is installed between a pair of upper and lower heating plates heated to a predetermined temperature in a decompression press, and after the pair of heating plates is brought into contact with the combined set, at least, a low-pressure load, which is up to 0.05 MPa, is applied for 10 seconds or longer from the start of pressurization.

SUMMARY OF THE INVENTION

However, in a case of bonding a substrate and a support to each other through an adhesive layer using a pressing method disclosed in JP-A-2002-192394, pressure force applied by a plate member is applied to a surface on which a step portion of the substrate is formed through a flat portion of the support. In a case where a step portion of a substrate is formed, it is difficult to make the adhesive layer uniformly flow into the step portion of the substrate. For this reason, it is not possible to sufficiently embed the adhesive layer into the step portion of the substrate, and there is a possibility that a bonding defect occurs. Therefore, a bonding method in which an adhesive layer can be sufficiently embedded in a step portion of a substrate, and occurrence of the bonding defect can be prevented is demanded.

The present invention has been accomplished in consideration of the above-described problem, and an object of the present invention is to provide a bonding method in which an adhesive layer can be sufficiently embedded in a step portion of a substrate, and occurrence of the bonding defect can be prevented.

To solve the above problems, a bonding method according to the present invention includes a pressing step of pressing a substrate and a support for supporting the substrate bonded to each other through an adhesive layer by a pressing unit, and after the pressing step, a pressure adjusting step of placing the substrate and the support bonded to each other through the adhesive layer in an environment having higher pressure than the pressure of the environment in which the pressing step is performed.

According to the present invention, the effects that an adhesive layer can be sufficiently embedded into a step portion of a substrate, and that occurrence of the bonding defect can be prevented are exhibited.

BRIEF DESCRIPTION OF THE DRAWINGS

FIGS. 1A to 1G are diagrams illustrating an outline of a bonding method according to one embodiment of the present invention and a modified example thereof.

DETAILED DESCRIPTION OF THE INVENTION

Figure 1A:
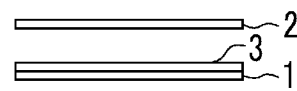

The bonding method according to the present invention includes a pressing step of pressing a substrate and a support for supporting the substrate bonded to each other through an adhesive layer by a pressing unit, and after the pressing step, a pressure adjusting step of placing the substrate and the support bonded to each other through the adhesive layer in an environment having higher pressure than the pressure of the environment in which the pressing step is performed.

According to the above configuration, a laminate obtained by bonding a substrate and a support to each other through an adhesive layer is pressed by a pressing unit, and in the pressure adjusting step, pressure is applied such that the support follows a step portion of the substrate. Therefore, it is possible to make the adhesive layer uniformly flow into the step portion of the substrate. Accordingly, the adhesive layer can be sufficiently embedded into the portion of the substrate, and occurrence of a bonding defect can be prevented.

First Embodiment

A bonding method according to one embodiment (First embodiment) will be described in more detail with reference to FIGS. 1A to 1G and FIG. 2. FIGS. 1A to 1G are diagrams illustrating an outline of a bonding method according to one embodiment. In addition, FIG. 2 is diagram showing an entire configuration of a laminate forming system 100 according to one embodiment.

Laminate Forming System 100

First, the configuration of the laminate forming system 100 for performing the bonding method according to the embodiment will be described with reference to FIG. 2. As shown in FIG. 2, the laminate forming system 100 is equipped with a superposition chamber 52 in which a substrate 1 and a support plate 2 are bonded to each other through an adhesive layer 3 and a pressure chamber 51 forming a laminate 10 by pressing the substrate 1 and the support plate 2 bonded to each other through the adhesive layer 3.

Figure 2:
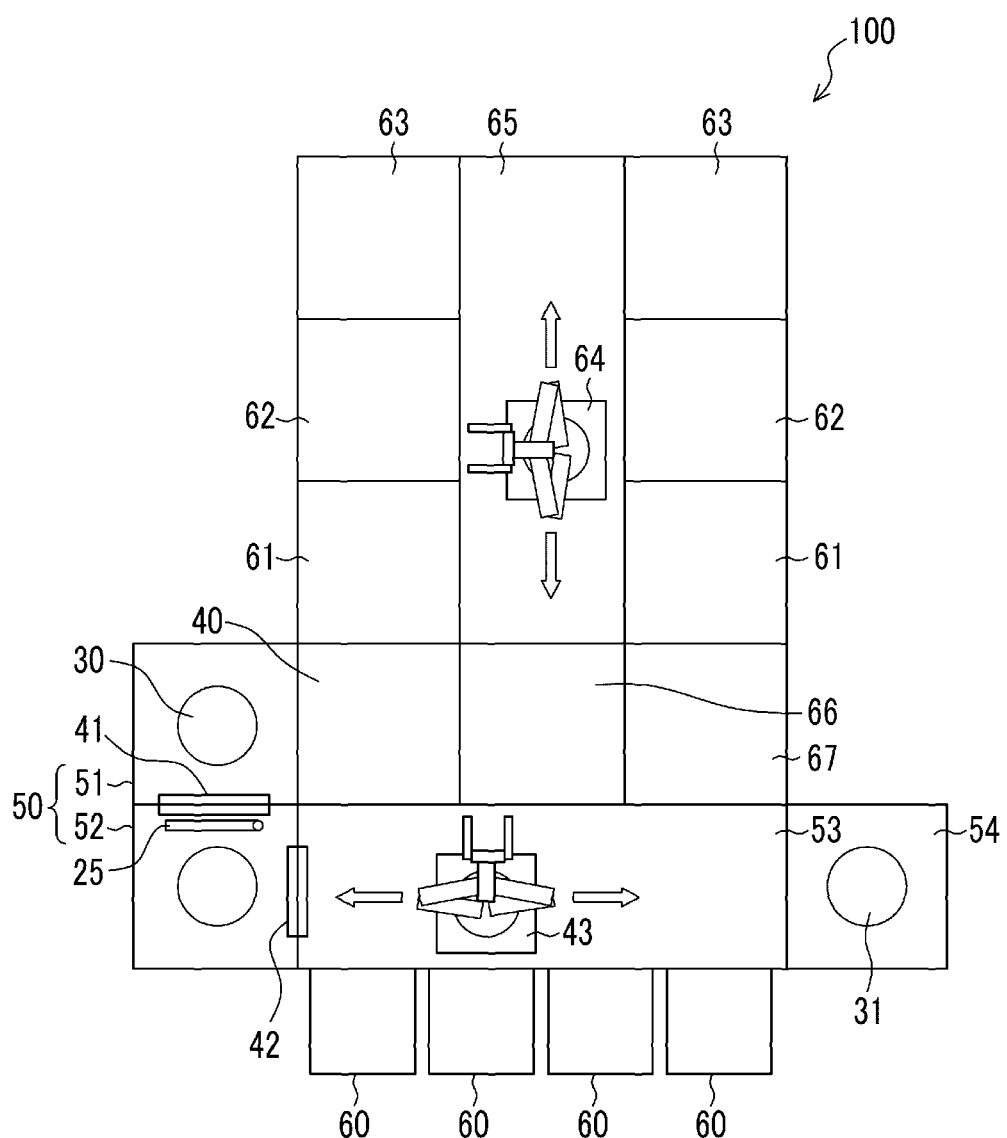
FIG. 2 is diagram showing an entire configuration of a laminate forming system according to one embodiment of the present invention.

In addition, as shown in FIG. 2, the laminate forming system 100 is further equipped with a first transportation unit 43 and a pressure adjusting chamber 54.

In addition, as shown in FIG. 2, the laminate forming system 100 may be equipped with a spinner (coating applicator) 62 for coating the substrate 1 with an adhesive and a bake plate (heating device) 61 for heating the substrate 1 to which an adhesive is coated to form the adhesive layer 3 on the substrate 1.

In addition, as shown in FIG. 2, the laminate forming system 100 may be equipped with a thickness distribution measuring device 67, a carrier station 60, a holding portion 40, a cooling portion 66, a second transportation unit 64, and a cleaning device 63.

Spinner 62

The spinner (coating applicator) 62 is intended for forming an adhesive layer on a substrate. The substrate 1 is introduced into the spinner 62 by the second transportation unit 64. After that, the spinner 62 spin-coats the substrate 1 with an adhesive while rotating the substrate 1. Moreover, the rotational speed of the substrate 1 is not particularly limited, and may be suitably set according to the type of the adhesive or the size of the substrate 1. In addition, the spinner may be equipped with a cleaning unit for coating with a washing solution for cleaning an adhesive adhered to an end surface or a rear surface of a substrate when coating the substrate with the adhesive.

Bake Plate 61

The bake plate (heating device) 61 is intended for heating a substrate coated with an adhesive by a coating applicator to form an adhesive layer on the substrate. In the embodiment, after an adhesive is coated on the substrate 1 by the spinner 62, the substrate 1 is mounted on the bake plate 61, and then, the adhesive is baked.

Bonding Unit 50

Figure 1B:
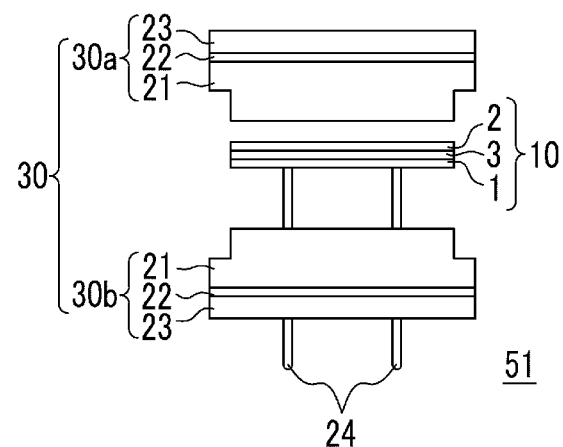
Figure 1C:
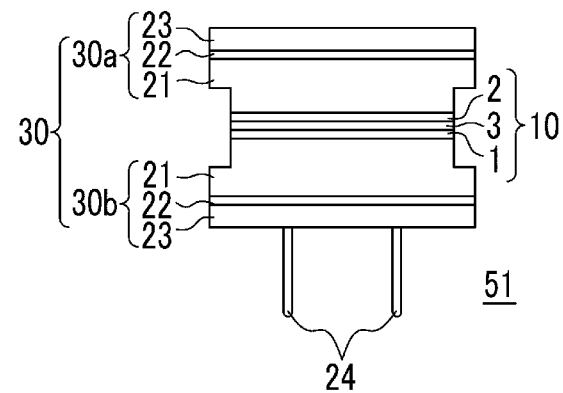

A bonding unit 50 is a unit equipped with the superposition chamber 52 and the pressure chamber 51, and is used for bonding a laminate 10. Here, the superposition chamber 52 and the pressure chamber 51 are configured so as to be able to move a laminate through a gate 41. In the embodiment, after superposing the substrate 1 and the support plate 2 through the adhesive layer 3 in the superposition chamber 52 (FIG. 1A), the adhesive layer 3 is heated while pressing the substrate 1 and the support plate 2 in the pressure chamber 51 (FIGS. 1B and 1C).

Superposition Chamber 52

The superposition chamber 52 is a room intended for superposing the substrate 1 and the support plate 2 through the adhesive layer 3. In the superposition chamber 52, for example, after a relative position between the substrate 1 and the support plate 2 is adjusted using a position adjustment portion (not shown) provided to the superposition chamber 52, superposition of the substrate 1 and the support plate 2 may be performed.

Pressure Chamber 51

The pressure chamber 51 is a room provided in the bonding unit 50 for bonding the substrate 1 and the support plate 2 to each other through the adhesive layer 3 and pressing the substrate 1 and the support plate 2 thus bonded. In the pressure chamber 51, a known decompressing unit is provided, and the internal pressure can be controlled.

In addition, in the pressure chamber 51, a plate member 30 formed of an upper plate member 30a and a lower plate member 30b is provided. Each of the upper plate member 30a and the lower plate member 30b is equipped with a press plate 21, a heater 22, and a base plate 23, and the lower plate member 30b is further equipped with a pin 24 (FIG. 1B).

The plate member 30 applies pressure force to the laminate 10 by moving up and down at least one side of the upper plate member 30a and the lower plate member 30b and sandwiching the laminate 10 therebetween.

The press plate 21 is a member for directly applying pressure force to the laminate 10 obtained by bonding the substrate 1 and the support plate 2 to each other through the adhesive layer 3. The press plate 21, for example, is formed of ceramics or the like. In addition, the surfaces of the press plate 21 with which the upper plate member 30a and the lower plate member 30b are opposed to each other are preferably formed such that flatness when not pressed becomes 1.0 μm or less. Here, the flatness is a numerical value showing a degree of unevenness to the plane, and "flatness is 1.0 μm or less" indicates that unevenness of the surface of the press plate 21 when not pressed is ±1.0 μm or less. By this, it is possible to uniformly apply pressure force to the laminate 10.

The heater 22, for example, is configured with a heating device such as a ribbon heater or a surface heater, and can heat the laminate 10 through the press plate 21. In addition, a heat insulating material may be provided between the heater 22 and the base plate 23. By this, it is possible to suppress release of the heat of the heater 22 to the base plate 23.

The base plate 23 is a member for transmitting pressure force generated by moving up and down at least one side of the upper plate member 30a and the lower plate member 30b to the press plate 21. The base plate 23 is formed of a metal such as stainless steel and the like, or ceramics or stone.

The pin 24 is provided in the lower plate member 30b, and is used in superposing the substrate 1 and the support plate and transferring out the laminate 10 after being bonded. In addition, the pin 24 also functions as a bonding prevention pin for preventing the laminate 10 from bonding to the lower plate member 30b by the adhesive layer protruding from the laminate 10. Moreover, the pin 24 may be provided in the upper plate member 30a.

By this, it is possible to prevent the laminate 10 from bonding to the upper plate member 30a.

In one embodiment, the superposition chamber 52 and the pressure chamber 51 in the bonding unit 50 can be a structure in which a wall partitioning the inside of one treatment chamber into two treatment chambers is provided. In addition, the superposition chamber 52 and the pressure chamber 51 may be a structure in which the superposition chamber 52 and the pressure chamber 51 are in contact with each other without a gap at each side surface. At the boundary of the superposition chamber 52 and the pressure chamber 51, the gate 41 for transferring the superposed substrate 1 and support plate 2, or the laminate 10 between the superposition chamber 52 and the pressure chamber 51 is provided. Opening and closing of the gate 41 are controlled by a shutter. In addition, in the superposition chamber 52, an openable and closable transferring window 42 for transferring the support plate 2, the substrate 1, and the laminate 10 between the bonding unit 50 and the first transportation unit 43 is provided. In the superposition chamber 52, a known decompressing unit is provided (not shown), and the state of the internal pressure can be independently controlled.

The gate 41 is formed such that the superposed substrate 1 and support plate 2 is moved from the superposition chamber 52 to the pressure chamber 51, and the laminate 10 can be moved from the pressure chamber 51 to the superposition chamber 52 in a state in which the shutter is open. The gate 41 has a structure in which by opening the shutter in a state in which both the superposition chamber 52 and the pressure chamber 51 are decompressed, the superposed substrate 1 and support plate 2 can be moved from the superposition chamber 52 to the pressure chamber 51 under decompression. Here, known units in the art can be used to open and close the gate 41, and for example, it is possible to apply a gate valve structure.

In the bonding unit 50, an internal transportation unit 25 for transferring the laminate 10 between the superposition chamber 52 and the pressure chamber 51 through gate 41 is further provided. Moreover, the internal transportation unit 25 is configured with an internal transportation arm and an arm pivot. Here, the arm pivot is preferably formed on the side closest to the side surface on which the transferring window 42 is formed.

By this, it is possible to shorten a stroke of transfer between the superposition chamber 52 and the first transportation unit 43. In addition, the revolving speed of the internal transportation arm may be preferably set according to the situation. By this, when the internal transportation arm holds the laminate 10, it is possible to make the internal transportation arm revolve at a low speed, and when the internal transportation arm does not hold the laminate 10, it is possible to make the internal transportation arm revolve at a high speed. In addition, it is possible to control the acceleration and deceleration such that rise and stop of the revolution of the internal transportation arm becomes smooth.

First Transportation Unit 43

The first transportation unit 43 is a unit transporting the substrate 1 between the bonding unit 50 and the pressure adjusting chamber 54. Here, the first transportation unit 43 is moved in a first transportation unit track 53 in the direction indicated by an arrow in FIG. 2. The first transportation unit 43 transports each of the substrate 1, the support plate 2, and the laminate 10 to a desired position in order to perform the following treatment after a necessary treatment ends. In addition, the first transportation unit 43 can also transport the substrate among the carrier station 60, the cooling portion 66, and the thickness distribution measuring device 67.

Pressure Adjusting Chamber 54

The pressure adjusting chamber 54 is a room for performing the pressure adjusting step, and in the pressure adjusting chamber 54, a stage 31 on which the laminate 10 transported from the pressure chamber 51 by the first transportation unit 43 is mounted is provided (FIGS. 1F and 2). In addition, in the pressure adjusting chamber 54, a known decompressing unit is provided, and the internal pressure can be controlled.

A wall for partitioning is provided between the pressure adjusting chamber 54 and the first transportation unit track 53 provided with the first transportation unit 43, and a gate and a shutter (not shown) for transferring the laminate 10 are provided to the wall. Here, opening and closing of the gate are controlled by the shutter.

Thickness Distribution Measuring Device 67

The thickness distribution measuring device 67 is intended for measuring the thickness distribution of a laminate. The thickness distribution of the laminate 10 shows an in-plane distribution of the thickness of the laminate 10 on the top surface (top surface of the support plate 2 or the substrate 1) of the laminate 10. The thickness distribution measuring device 67 is not particularly limited as long as the thickness distribution of an object can be measured, and known devices can be used, and for example, it is possible to suitably measure the thickness distribution of a laminate by using a device such as a stylus-type displacement meter or a laser displacement meter. As a result, it is possible to perform management of product quality or detection of abnormality of the laminate 10 in a process of thinning of a substrate or implementation.

Carrier Station 60

The carrier station (storing portion) 60 stores a substrate and a support. In addition, it is possible to put the substrate 1 and the support plate 2 into the laminate forming system 100 through the carrier station 60. In addition, it is possible to take out the laminate 10 formed in the pressure chamber 51 from the laminate forming system 100 through the carrier station 60.

Holding Portion 40

The holding portion 40 is intended for alignment of the substrate 1 and the support plate 2. The holding portion 40 is equipped with an imaging portion and a center position detecting portion, and is configured so as to hold the substrate 1 or the support plate 2 before being superposed. The imaging portion is configured so as to image each region including the end surfaces different from each other of the substrate 1 or the support plate 2 held in the holding portion 40.

The center position detecting portion detects the center position of the substrate 1 or the support plate 2 held in the holding portion 40 based on a plurality of images taken by the imaging portion. The center position detecting portion may be configured so as to detect the center position by calculating a virtual circle based on the image of the end surface of a disc. The detection technology of the center position based on the image of the end surface is not particularly limited and a known image processing may be used.

Cooling Portion

The cooling portion 66 is provided with a cooling plate for adjusting the temperature of a substrate by cooling the substrate and a position adjustment device for adjusting the position of the substrate. As shown in FIG. 2, the first transportation unit 43 and the second transportation unit 64 perform transfer of the substrate 1 across the cooling portion 66.

It is possible to cool the substrate 1 or the laminate 10 by mounting the substrate 1 or the laminate 10 on the cooling plate. In addition, using the position adjustment device during cooling, it is possible to perform alignment of the substrate 1. Therefore, space saving of the laminate forming system 100 is possible, and it is possible to shorten the formation time of the laminate.

Furthermore, the cooling portion 66 has a cooling area for naturally cooling the substrate 1 and the laminate 10 after forming the adhesive layer 3. The cooling area may be a configuration which can efficiently release heat of the substrate 1 and the laminate 10. For example, in the cooling area, a supporting point for supporting the substrate 1 and the laminate 10 is formed, and by supporting the inner peripheral portion on the surface of the substrate 1 and the laminate 10 by three to ten support points, it is possible to efficiently release the entire heat of the substrate 1 and the laminate 10.

Second Transportation Unit

The second transportation unit 64 transports the substrate 1 among the cooling portion 66, the bake plate 61, the spinner 62, and the cleaning device 63. In addition, the second transportation unit 64 is moved in a second transportation unit track 65 in the direction indicated by an arrow in FIG. 2. The second transportation unit 64 transports the substrate 1 to each desired position in order to perform the following treatment after a necessary treatment ends.

Cleaning Device 63

The cleaning device 63 is intended for cleaning a substrate coated with an adhesive. As a cleaning method, for example, while rotating the substrate 1 of which the end surface or the rear surface is adhered with an adhesive at 3,000 rpm, a washing solution may be coated on the end surface or the rear surface. The washing solution is not limited as long as it can dissolve the adhesive, and for example, a diluent solvent of the adhesive used for forming the adhesive layer 3 can be used.

Bonding Method According to Embodiment

Next, the bonding method according to the embodiment will be described with reference to FIGS. 1A to 1G and FIG. 2. In addition, as shown in FIG. 1, the bonding method according to the embodiment includes the pressing step (FIGS. 1A to 1C) of pressing using a plate member (pressing unit) 30 after bonding the substrate 1 and the support plate (support) 2 for supporting the substrate 1 to each other through the adhesive layer 3, and after the pressing step, a pressure adjusting step (FIG. 1F) of placing the substrate 1 and the support plate 2 bonded to each other through the adhesive layer 3 in an environment having higher pressure than the pressure of the environment in which the pressing step is performed.

In addition, the bonding method according to the embodiment includes, after the pressing step, a transporting step (FIG. 1E) of transporting the substrate 1 and the support plate 2 which are bonded to each other through the adhesive layer 3 to the pressure adjusting chamber 54 for performing the pressure adjusting step.

Pressing Step

In the pressing step included in the bonding method according to the embodiment, the substrate 1 on which the adhesive layer 3 is formed and the support plate 2 are bonded to each other through the adhesive layer 3 (FIG. 1A) in the superposition chamber 52 of the bonding unit 50 provided in the laminate forming system 100 shown in FIG. 2, then, the substrate 1 and the support plate 2 superposed through the adhesive layer 3 are transported to the pressure chamber 51 (FIG. 1B), and are pressed using the plate member 30 (FIG. 1C). By this, the laminate 10 in which the substrate 1 and the support plate 2 are bonded to each other through the adhesive layer 3 is formed.

Substrate 1

As shown in FIG. 1A, the substrate 1 is bonded to the support plate 2 through the adhesive layer 3. As the substrate 1, for example, any substrate such as a wafer substrate, a ceramic substrate, a thin film substrate, a flexible substrate, and the like can be used. In addition, in an embodiment, a circuit is formed on the surface of the side of the substrate 1 on which the adhesive layer 3 is formed. Here, in a case where the circuit formed on the substrate 1 is three-dimensional, a step difference due to unevenness is formed on the substrate 1.

Adhesive Layer 3

The adhesive layer 3 is used for bonding the substrate 1 and the support plate 2 to each other. The method of forming the adhesive layer is not limited to the method of coating the substrate 1 with an adhesive by the spinner 62. As the method of forming the adhesive layer, methods such as a spin coating method, a dipping method, a roller blade method, a spraying coating method, a slit coating method can be exemplified. In addition, for example, instead of directly coating the substrate 1 with an adhesive, the adhesive layer 3 may be formed by bonding a film of which a surface is coated with an adhesive in advance to the substrate 1. The adhesive layer 3 may be formed by applying an adhesive to the substrate 1 or by applying an adhesive to the support plate 2.

The thickness of the adhesive layer 3 may be suitably set depending on the type of the substrate 1 and the support plate 2 to be bonded, and a treatment to be performed on the substrate 1 after bonding. The thickness of the adhesive layer 3 is preferably in a range of 10 μm to 150 μm, and more preferably in a range of 15 μm to 100 μm.

As the adhesive, for example, various adhesives known in the related art such as an acrylic adhesive, a novolac-based adhesive, a naphthoquinone-based adhesive, a hydrocarbon-based adhesive, a polyimide-based adhesive, and an elastomer can be used as an adhesive constituting the adhesive layer 3 according to the present invention. Hereinafter, a composition of a resin which is contained in the adhesive layer 3 in the embodiment will be described.

The resin contained in the adhesive layer 3 is not limited as long as the resin has adhesive property, and examples of the resin include a hydrocarbon resin, an acryl-styrene-based resin, a maleimide-based resin, an elastomer resin, and combinations of these.

The glass transition temperature (Tg) of the adhesive varies depending on the type and the molecular weight of the above resin, and a material mixed to the adhesive such as a plasticizer or the like. The type and the molecular weight of the resin contained in the adhesive can be suitably selected according to the type of the substrate or the support, and Tg of the resin used in the adhesive is preferably in a range of −60° C. to 200° C., and more preferably in a range of −25° C. to 150° C. When Tg of the resin used in the adhesive is in a range of −60° C. to 200° C., it is possible to preferably reduce the adhesive property of the adhesive layer 3 without the need for excessive energy for cooling. In addition, Tg of the adhesive layer 3 may be suitably adjusted by mixing a plasticizer, a resin with a low degree of polymerization, or the like.

For example, the glass transition temperature (Tg) can be measured by using a known differential scanning calorimeter (DSC).

Hydrocarbon Resin

The hydrocarbon resin is a resin having a hydrocarbon skeleton and formed by polymerizing a monomer composition. Examples of the hydrocarbon resin include a cycloolefin-based polymer (hereinafter, also referred to as "resin (A)"), or at least one resin (hereinafter, also referred to as "resin (B)") selected from the group consisting of a terpene-based resin, a rosin-based resin, and a petroleum-based resin, and the hydrocarbon resin is not limited thereto.

The resin (A) may be a resin formed by polymerizing monomer components including cycloolefin-based monomers. Specifically, a ring-opened (co)polymer of a monomer component including the cycloolefin-based monomer, and a resin obtained by addition-(co)polymerizing the monomer component including the cycloolefin-based monomer can be exemplified.

Examples of the cycloolefin-based monomer included in the monomer component constituting the resin (A) include bicyclic compounds such as norbornene and norbornadiene, tricyclic compounds such as dicyclopentadiene and dihydroxy pentadiene, tetracyclic compounds such as tetracyclododecene, pentacyclic compounds such as cyclopentadiene trimer, heptacyclic compounds such as tetracyclopentadiene, or alkyl (such as methyl, ethyl, propyl, or butyl) substituents, alkenyl (such as vinyl) substituents, alkylidene (such as ethylidene) substituents, and aryl (such as phenyl, tolyl, or naphthyl) substituents of these polycyclic compounds. Among them, in particular, a norbornene-based monomer selected from the group consisting of norbornene, tetracyclododecene, or alkyl substituents thereof is preferable.

The monomer component constituting the resin (A) may contain other monomers which can be copolymerized with the above-described cycloolefin-based monomers, and preferably contains an alkene monomer, for example. Examples of the alkene monomer include ethylene, propylene, 1-butene, isobutene, 1-hexene, and α-olefin. The alkene monomer may be linear or branched.

In addition, the cycloolefin monomer is preferably contained in the monomer component constituting the resin (A) from the viewpoint of a high heat resistance (low pyrolytic property and thermal weight loss property). A ratio of the cycloolefin monomer with respect to the entire monomer component constituting the resin (A) is preferably 5 mol % or greater, more preferably 10 mol % or greater, and still more preferably 20 mol % or greater. In addition, the ratio of the cycloolefin monomer with respect to the entire monomer component constituting the resin (A), which is not particularly limited, is preferably 80 mol % or less, and more preferably 70 mol % or less from the viewpoint of solubility and stability with time in a solution.

In addition, the monomer components constituting the resin (A) may contain linear or branched alkene monomers. A ratio of the alkene monomer with respect to the entire monomer component constituting the resin (A) is preferably 10 mol % to 90 mol %, more preferably 20 mol % to 85 mol %, and still more preferably 30 mol % to 80 mol % from the viewpoint of solubility and flexibility.

Moreover, it is preferable that the resin (A), for example, as a resin formed by polymerizing monomer components consisting of cycloolefin-based monomers and alkene monomers, be a resin having no polar group to suppress the generation of gas at high temperature.

The polymerization method and the polymerization conditions when the monomer component is polymerized are not particularly limited, and may be suitably set according to common methods.

Examples of commercially available products that can be used as the resin (A) include "TOPAS" manufactured by POLYPLASTICS Co., Ltd., "APEL" manufactured by Mitsui Chemicals, Inc., "ZEONOR" and "ZEONEX" manufactured by ZEON CORPORATION, and "ARTON" manufactured by JSR Corporation.

The glass transition temperature (Tg) of the resin (A) is preferably 60° C. or higher, and particularly preferably 70° C. or higher. In a case where the glass transition temperature of the resin (A) is 60° C. or higher, when the laminate is exposed to a high temperature environment, it is possible to further suppress softening of the adhesive layer 3.

The resin (B) is at least one resin selected from the group consisting of a terpene-based resin, a rosin-based resin, and a petroleum-based resin. Specifically, examples of the terpene-based resin include a terpene resin, a terpene phenol resin, a modified terpene resin, a hydrogenated terpene resin, and a hydrogenated terpene phenol resin. Examples of the rosin-based resin include rosin, rosin ester, hydrogenated rosin, hydrogenated rosin ester, polymerized rosin, polymerized rosin ester, and modified rosin. Examples of the petroleum-based resin include an aliphatic or aromatic petroleum resin, a hydrogenated petroleum resin, a modified petroleum resin, an alicyclic petroleum resin, and a coumarone-indene petroleum resin. Among these, a hydrogenated terpene resin and a hydrogenated petroleum resin are more preferable.

The softening point of the resin (B), which is not particularly limited, is preferably 80° C. to 160° C. In a case where the softening point of the resin (B) is 80° C. or higher, when the laminate is exposed to a high temperature environment, it is possible to suppress softening, and an adhesive failure does not occur. On the other hand, in a case where the softening point of the resin (B) is 160° C. or lower, when the laminate is peeled, the peeling rate becomes excellent.

The weight average molecular weight of the resin (B), which is not particularly limited, is preferably 300 to 3,000. When the weight average molecular weight of the resin (B) is 300 or greater, heat resistance becomes sufficient, and the amount of degasification is reduced under a high temperature environment. On the other hands, in a case where the weight average molecular weight of the resin (B) is 3,000 or less, when the laminate is peeled, the peeling rate becomes excellent. Moreover, the weight average molecular weight of the resin (B) in the embodiment means a molecular weight in terms of polystyrene measured using gel permeation chromatography (GPC).

Moreover, as the resin, the resins (A) and (B) may be used in combination. By mixing, the heat resistance and the peeling rate become excellent. For example, the mixing ratio between the resin (A) and the resin (B) is preferably (A):(B)=80:20 to 55:45 (mass ratio) since the peeling rate, the heat resistance under a high temperature environment, and the flexibility is excellent at this ratio.

Acryl-Styrene-Based Resin

Examples of the acryl-styrene-based resin include resins obtained by polymerization using styrene or styrene derivatives, and (meth)acrylic acid esters as a monomer.

Examples of the (meth)acrylic acid ester include (meth)acrylic acid alkyl ester formed of a chain structure, (meth)acrylic acid ester having an aliphatic ring, and (meth)acrylic acid ester having an aromatic ring. Examples of the (meth)acrylic acid alkyl ester formed of a chain structure include acrylic long chain alkyl ester having an alkyl group having 15 to 20 carbon atoms, and acrylic alkyl ester having an alkyl group having 1 to 14 carbon atoms. Examples of the acrylic long chain alkyl ester include alkyl esters of an acrylic acid or a methacrylic acid in which the alkyl group is an n-pentadecyl group, an n-hexadecyl group, an n-heptadecyl group, an n-octadecyl group, an n-nonadecyl group, or an n-eicosyl group. Moreover, the alkyl group may be branched.

Examples of the acrylic alkyl ester having an alkyl group having 1 to 14 carbon atoms include known acrylic alkyl ester used in an existing acrylic adhesive. For example, alkyl esters of an acrylic acid or a methacrylic acid in which the alkyl group is a methyl group, an ethyl group, a propyl group, a butyl group, a 2-ethylhexyl group, an isooctyl group, an isononyl group, an isodecyl group, a dodecyl group, a lauryl group, and a tridecyl group are exemplified.

Examples of the (meth)acrylic acid ester having an aliphatic ring include cyclohexyl (meth)acrylate, cyclopentyl (meth)acrylate, 1-adamantyl (meth)acrylate, norbornyl (meth)acrylate, isobornyl (meth)acrylate, tricyclodecanyl (meth)acrylate, tetracyclododecanyl (meth)acrylate, and dicyclopentanyl (meth)acrylate, and among these, isobornyl methacrylate and dicyclopentanyl (meth)acrylate are preferable.

The (meth)acrylic acid ester having an aromatic ring is not particularly limited, and examples of the aromatic ring include a phenyl group, a benzyl group, a tolyl group, a xylyl group, a biphenyl group, a naphthyl group, an anthracenyl group, a phenoxymethyl group, and a phenoxyethyl group. In addition, the aromatic ring may have a linear or a branched alkyl group having 1 to 5 carbon atoms. Specifically, phenoxyethylacrylate is preferable.

Maleimide-Based Resin

Examples of the maleimide-based resin include resins obtained by polymerizing maleimides having an alkyl group such as N-methyl maleimide, N-ethyl maleimide, N-n-propyl maleimide, N-isopropyl maleimide, N-n-butyl maleimide, N-iso-butyl maleimide, N-sec-butyl maleimide, N-tert-butyl maleimide, N-n-pentyl maleimide, N-n-hexyl maleimide, N-n-heptyl maleimide, N-n-octyl maleimide, N-lauryl maleimide, and N-stearyl maleimide; maleimides having an aliphatic hydrocarbon group such as N-cyclopropyl maleimide, N-cyclobutyl maleimide, N-cyclopentyl maleimide, N-cyclohexyl maleimide, N-cycloheptyl maleimide, and N-cyclooctyl maleimide; and aromatic maleimides having an aryl group such as N-phenyl maleimide, N-m-methyl phenyl maleimide, N-o-methyl phenyl maleimide, and N-p-methyl phenyl maleimide, as a monomer.

For example, it is possible to use a cycloolefin copolymer which is a copolymer having a repeating unit represented by the following Chemical formula (1) and a repeating unit represented by the following Chemical formula (2), as a resin of an adhesive component.

[Chemical formula 1]

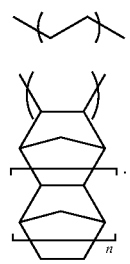

(1)

(2)

(In Chemical formula (2), n represents 0 or an integer of 1 to 3.)

As the cycloolefin copolymer, APL 8008T, APL 8009T, and APL 6013T (manufactured by Mitsui Chemicals, Inc.) can be used.

Elastomer

An elastomer preferably includes a styrene unit as a constituent unit of a main chain, and the "styrene unit" may have a substituent. Examples of the substituent include an alkyl group having 1 to 5 carbon atoms, an alkoxy group having 1 to 5 carbon atoms, an alkoxyalkyl group having 1 to 5 carbon atoms, an acetoxy group, and a carboxyl group. In addition, the content of the styrene unit is more preferably in a range of 14% by weight to 50% by weight. Furthermore, the weight average molecular weight of the elastomer is preferably in a range of 10,000 to 200,000.

When the content of the styrene unit is in a range of 14% by weight to 50% by weight and the weight average molecular weight of an elastomer is in a range of 10,000 to 200,000, the adhesive layer can be removed more easily and quickly since the elastomer is easily dissolved in hydrocarbon solvents described below. In addition, when the content of the styrene unit and the weight average molecular weight of the elastomer are in the above-described range, excellent resistance is exhibited with respect to resist solvents (for example, PGMEA, PGME, and the like), acids (hydrofluoric acid and the like), and alkali (TMAH and the like) to which the wafer is exposed when subjected to a resist lithography step.

Moreover, the above-described (meth)acrylic acid ester may be further mixed in the elastomer.

In addition, the content of the styrene unit is more preferably 17% by weight to 40% by weight.

The weight average molecular weight is more preferably in a range of 20,000 to 150,000.

As the elastomer, various elastomers of which the content of the styrene unit is in a range of 14% by weight to 50% by weight, and of which the weight average molecular weight of an elastomer is in a range of 10,000 to 200,000 can be used. Examples of the elastomer include a polystyrene-poly (ethylene/propylene) block copolymer (SEP), a styrene-isoprene-styrene block copolymer (SIS), a styrene-butadiene-styrene block copolymer (SBS), a styrene-butadiene-butylene-styrene block copolymer (SBBS), and hydrogenated products thereof, a styrene-ethylene-butylene-styrene block copolymer (SEBS), a styrene-ethylene-propylene-styrene block copolymer (styrene-isoprene-styrene block copolymer) (SEPS), a styrene-ethylene-ethylene-propylene-styrene block copolymer (SEEPS), a styrene-ethylene-ethylene-propylene-styrene block copolymer (Septon V9461 (manufactured by KURARAY Co., Ltd.), Septon V9475 (manufactured by KURARAY Co., Ltd.)) of which the styrene block is a reaction crosslinking type, a styrene-ethylene-butylene-styrene block copolymer (having a reactive polystyrene-based hard block, Septon V9827 (manufactured by KURARAY Co., Ltd.)) of which the styrene block is a reaction crosslinking type, and polystyrene-poly (ethylene-ethylene/propylene)block-polystyrene block copolymer (SEEPS-OH: terminal hydroxyl group modified). Elastomers of which the content of the styrene unit and the weight average molecular weight are in the above range can be used.

In addition, among the elastomers, a hydrogenated product is more preferable. In a case where the elastomer is a hydrogenated product, stability with respect to heat is improved, and changes in quality such as decomposition and polymerization are less likely to occur. In addition, it is more preferable from the viewpoint of solubility in hydrocarbon-based solvents and resistance to resist solvents.

In addition, among the elastomers, an elastomer of which both terminals are block polymers of styrene is more preferable. This is because higher heat resistance is exhibited by blocking styrene having high heat stability at both terminals thereof.

More specifically, the elastomer is more preferably a hydrogenated product of a block copolymer of styrene and conjugated diene. Stability with respect to heat is improved, and changes in quality such as decomposition and polymerization are less likely to occur. In addition, higher heat resistance is exhibited by blocking styrene having high heat stability at both terminals thereof. Furthermore, it is more preferable from the viewpoint of solubility in hydrocarbon-based solvents and resistance to resist solvents.

Examples of a commercially available product which can be used as the elastomer included in the adhesive constituting the adhesive layer 3 include "Septon (product name)" manufactured by KURARAY Co., Ltd., "HYBRAR (product name)" manufactured by KURARAY Co., Ltd., "Tuftec (product name)" manufactured by Asahi Kasei Corporation, and "DYNARON (product name)" manufactured by JSR Corporation.

The content of the elastomer included in the adhesive constituting the adhesive layer 3 is preferably in a range of 50 parts by weight to 99 parts by weight, more preferably in a range of 60 parts by weight to 99 parts by weight, most preferably in a range of 70 parts by weight to 95 parts by weight if the total amount of the adhesive composition is 100 parts by weight. When the content of the elastomer is in these ranges, it is possible to suitably bond a wafer and a support to each other while maintaining heat resistance.

In addition, plural types of elastomers may be used in combination. In other words, the adhesive constituting the adhesive layer 3 may contain plural types of elastomers. At least one among plural types of elastomers may include the styrene unit as a constituent unit of a main chain. In addition, when at least one among plural types of elastomers has the content of the styrene unit in a range of 14% by weight to 50% by weight, or the weight average molecular weight in a range of 10,000 to 200,000, it is in a scope of the present invention. In addition, in a case where plural types of elastomers are contained in the adhesive constituting the adhesive layer 3, as a result of mixing, the content of the styrene unit may be adjusted so as to be in the above-described range. For example, when Septon 4033 of Septon (product name) manufactured by KURARAY Co., Ltd. of which the content of the styrene unit is 30% by weight and Septon 2063 of Septon (product name) of which the content of the styrene unit is 13% by weight manufactured by KURARAY Co., Ltd. are mixed at a weight ratio of 1:1, the content of styrene with respect to the entire elastomer included in the adhesive becomes 21% by weight to 22% by weight, and thus, becomes 14% by weight or greater. In addition, for example, when an elastomer of which the content of the styrene unit is 10% by weight and an elastomer of which the content of the styrene unit is 60% by weight are mixed at a weight ratio of 1:1, the content of styrene becomes 35% by weight, and thus the content is in the above-described range. The present invention may also be such a form. In addition, it is most preferable that all of the plural types of elastomers included in the adhesive constituting the adhesive layer 3 contain the styrene unit in the above-described range, and the weight average molecular weight in the above-described range.

Moreover, the adhesive layer 3 is preferably formed using a resin other than a photocurable resin (for example, a UV curable resin). By using a resin other than a photocurable resin, it is possible to prevent residues from remaining around minute unevenness of the supported substrate after peeling or removing the adhesive layer 3.

In particular, as the adhesive constituting the adhesive layer 3, an adhesive, which is not dissolved in all solvents but dissolved in only a specific solvent, is preferable. This is because the adhesive layer 3 is removable by being dissolved in the solvent without applying physical force to the substrate 1. When removing the adhesive layer 3, it is possible to easily remove the adhesive layer 3 without damage or deformation of the substrate 1 even from the substrate 1 of which the strength is reduced.

Diluent Solvent

Examples of a diluent solvent used when forming the adhesive layer 3 include linear hydrocarbons such as hexane, heptane, octane, nonane, methyloctane, decane, undecane, dodecane, tridecane, branched hydrocarbons having 4 to 15 carbon atoms, cyclic hydrocarbons such as cyclohexane, cycloheptane, cyclooctane, naphthalene, decahydronaphthalene, tetrahydronaphthalene, terpene solvents such as p-menthane, o-menthane, m-menthane, diphenyl menthane, 1,4-terpine, 1,8-terpine, bornane, norbornane, pinane, thujane, carane, longifolene, geraniol, nerol, linalool, citral, citronellol, menthol, isomenthol, neomenthol, α-terpineol, β-terpineol, γ-terpineol, terpinene-1-ol, terpinene-4-ol, dihydroterpinylacetate, 1,4-cineol, 1,8-cineol, borneol, carvone, ionone, thujone, camphor, d-limonene, 1-limonene, and dipentene; lactones such as γ-butyrolactone; ketones such as acetone, methylethylketone, cyclohexanone (CH), methyl-n-pentylketone, methylisopentylketone, and 2-heptanone; polyalcohols such as ethylene glycol, diethylene glycol, propylene glycol, and dipropylene glycol; compounds having a ester bond such as ethyleneglycol monoacetate, diethylene glycol monoacetate, propylene glycol monoacetate, and dipropylene glycol monoacetate, derivatives of polyalcohols such as compounds having an ether bond such as monoalkyl ether such as monomethyl ether, monoethyl ether, monopropyl ether, monobutyl ether or monophenyl ether of the polyalcohols or the compounds having the ester bond (among these, propylene glycol monomethyl ether acetate (PGMEA) and propylene glycol monomethyl ether (PGME) are preferable), cyclic ethers such as dioxane, esters such as methyl lactate, ethyl lactate (EL), methyl acetate, ethyl acetate, butyl acetate, methoxy butyl acetate, methyl pyruvate, ethyl pyruvate, methyl methoxypropionate, and ethyl ethoxypropionate; and aromatic organic solvents such as anisole, ethylbenzyl ether, cresylmethyl ether, diphenyl ether, dibenzyl ether, phenetole, and butylphenyl ether.

Other Components

The adhesive constituting the adhesive layer 3 may further include another miscible substance in such a range that no essential feature is impaired. For example, generally used various additives such as additive resin, a plasticizer, an adhesion auxiliary substance, a stabilizer, a colorant, a thermal polymerization inhibitor, and a surfactant used to improve performance of an adhesive can be further used.

In the bonding method according to the embodiment, a portion of the adhesive layer 3 formed on the substrate 1 which portion is outside a raised portion (edge bead) of the outer peripheral portion of the adhesive layer 3 may be removed after forming the adhesive layer 3. By this, it is possible to remove the adhesive coated in excess. Therefore, it is possible to prevent the adhesive layer 3 from protruding from the outer peripheral portion of the laminate 10 in the pressing step and excessively adhering to the support plate 2. Furthermore, it is possible to cause the adhesive layer 3 to spread in such a manner as to cover an end of the outer peripheral portion of the substrate 1, so that the step portion on the substrate 1 can be sealed from the outside.

As a method of removing the adhesive layer 3 formed on the outer peripheral portion of the substrate 1, a known method may be used, and, the method is not particularly limited, and for example, a solvent may be sprayed with respect to the outer peripheral portion of the adhesive layer 3, or a solvent may be supplied using a dispense nozzle. In addition, spray or supply of a solvent may be performed while rotating the substrate 1.

Moreover, a solvent for dissolving the adhesive layer 3 may be suitably selected depending on the type of the adhesive and is not particularly limited. For example, a solvent used as the diluent solvent described above can be used, and in particular, a linear hydrocarbon, a branched hydrocarbon having 4 to 15 carbon atoms, or a cyclic hydrocarbon (terpenes) such as monoterpenes and diterpenes can be preferably used.

(Adhesive Film)

Formation of the adhesive layer 2 is not limited to application, and may be made in various ways depending on purposes. For example, an adhesive film may be used. Specifically, an adhesive layer is formed on a film such as a flexible film with use of an adhesive and then the film is dried. Subsequently, the film (adhesive film) is attached to a workpiece for use (adhesive film method).

In a case where the adhesive layer 3 is formed with use of the adhesive film, an adhesive layer may be formed on a film with use of an adhesive used for the adhesive layer 3.

The adhesive film may be used with its adhesive layer coated with a protective film. In this case, the adhesive layer 3 can be easily provided on the substrate 1 or the support plate 2 by peeling off the protective film on the adhesive layer, laminating the exposed adhesive layer on the substrate 1 or the support plate 2, and then peeling off the film from the adhesive layer.

Therefore, with use of this adhesive film, it is possible to form an adhesive layer with a better evenness in film thickness and with a better surface smoothness than those of the adhesive layer 3 formed by directly applying an adhesive onto the substrate 1 or the support plate 2.

A film for use in production of the adhesive film is not particularly limited as long as the film is a releasing film which allows an adhesive layer on the film to be peeled off and allows the adhesive layer to be transferred onto a surface to be processed of the substrate or the support plate. An example of the film is a flexible film made of a synthetic resin film of 15-125 μm in film thickness, such as polyethylene terephthalate, polyethylene, polypropylene, polycarbonate, and polyvinylchloride. It is preferable that the film has been subjected to a releasing treatment for easiness in transfer, if necessary.

The adhesive layer may be formed on the film with use of a publicly known method appropriately depending on the film thickness and evenness of a desired adhesive layer so that the adhesive layer on the film has a thickness of 10-1000 μm in a dried state.

In a case of using the protective film, the protective film is not limited as long as it can be peeled off from the adhesive layer. Preferable examples of the protective film include a polyethylene terephthalate film, a polypropylene film, and a polyethylene film. The protective film is preferably coated with silicon or baked with silicon. This is because being coated with silicon or baked with silicon makes it easier to peel off the protective film from the adhesive layer. A thickness of the protective film is not particularly limited, but is preferably 15-125 μm. This is because the thickness in that range makes it possible to secure flexibility of the adhesive film with the protective film.

Use of the adhesive film is not particularly limited. For example, in the case of using the protective film, the protective film is peeled off from the adhesive film, and then the adhesive film is attached to the substrate 1 or the support plate 2 in such a manner that the exposed adhesive layer is superimposed on the substrate 1 or the support plate 2, and a heat roller is moved on the film (on a surface of the film which surface is opposite to a surface where the adhesive layer is formed), so that the adhesive layer 3 is thermally pressed to the surface of the substrate 1 or the support plate 2. Although not limited, in the case of forming the adhesive layer 3 with use of the adhesive film, formation of the adhesive layer 3 on the support plate 2 will allow the adhesive layer 3 to more appropriately follow a step portion on the substrate 1 in the subsequent pressing step and pressure adjusting step.

The protective film peeled off from the adhesive film can be stored and reused by rolling the protective film in turn with use of a roller such as a take-up roller.

Support Plate 2

The support plate 2 is a supporting member which supports the substrate 1, and the support plate 2 may have a strength necessary to prevent the substrate 1 from being damaged or deformed at the time of performing a process such as thinning, transportation, or implementation of the substrate 1. From the viewpoints as described above, as the support plate, a plate formed of glass, silicon, and an acrylic resin is exemplified.

Here, other layers than the adhesive layer may be further formed between the substrate and the support plate as long as the bonding is not hindered. For example, a release layer altered by irradiation with light may be formed between the support plate and the adhesive layer. By the formed release layer, it is possible to easily separate the substrate and the support plate by irradiation of light after a process such as thinning, transportation, or implementation of the substrate.

Pressing Conditions

Hereinafter, the conditions and the order of the pressing step will be described with reference to FIGS. 1A to 1G and FIG. 2. The pressing step is performed in the superposition chamber 52 and the pressure chamber 51 which are equipped in the bonding unit 50 (FIGS. 1A to 1C and FIG. 2).

In the superposition chamber 52 and the pressure chamber 51, the pressure of the environment for performing the pressing step by the decompressing unit is adjusted. Here, in the embodiment, the pressure of the environment for performing the pressing step in the superposition chamber 52 and the pressure chamber 51 is preferably in a range of 0.1 Pa to 100 kPa, more preferably in a range of 0.1 Pa to 5 kPa, and most preferably in a range of 0.1 Pa to 1 kPa. In a case where the pressure of the environment for performing the pressing step is in a range of 0.1 Pa to 100 kPa, it is possible to suitably prevent air from entering between the adhesive layer 3 and the support plate 2 when bonding the substrate 1 and the support plate 2 to each other through the adhesive layer 3. In addition, it is possible to adjust the pressure of the environment for performing the following pressure adjusting step to atmospheric pressure.

First, a transferring window 42 in the superposition chamber 52 shown in FIG. 2 is opened. Then, the first transportation unit 43 introduces the substrate 1 on which the adhesive layer 3 is formed with the spinner 62 and the bake plate 61 and the support plate 2 into the superposition chamber 52 of which the pressure is adjusted (FIG. 1A). Then, the transferring window 42 in the superposition chamber 52 is closed.

Then, the positions of the substrate 1 and the support plate 2 are adjusted such that the center positions detected in the holding portion 40 are superposed using a position adjusting portion (not shown) provided in the superposition chamber 52. Thereafter, the substrate 1 and the support plate 2 are superposed through the adhesive layer 3.

Then, the gate 41 shown in FIG. 2 is opened, and the laminate 10 obtained by superposing the substrate 1 and the support plate 2 through the adhesive layer 3 is transported to the pressure chamber 51 through the gate 41 by the internal transportation unit 25. Subsequently, by moving the pin 24 provided in the lower plate member 30b in the pressure chamber 51 downward, the laminate 10 is mounted on the lower plate member 30b (FIG. 1B). Then, the gate 41 is closed. Thereafter, the laminate 10 is preheated in the pressure chamber 51.

Here, the temperature for preheating the laminate 10 is preferably in a range of 40° C. to 300° C. By this, it is possible to adjust the viscosity of the adhesive layer 3, and when applying a pressure force to the laminate 10, it is possible to make the adhesive layer 3 suitably flow.

Then, after sandwiching the laminate 10 between the upper plate member 30a and the lower plate member 30b, a pressure force is applied to the laminate 10 by the plate member 30 (FIG. 1C). Moreover, the pressure in the pressure chamber 51 during pressing of the laminate 10 by the plate member 30 is adjusted to the same pressure as the pressure in the superposition chamber 52.

In the pressing step included in the bonding method according to the embodiment, the substrate 1 and the support plate 2 bonded to each other through the adhesive layer 3 are heated. By this, it is possible to adjust the viscosity of the adhesive used in the adhesive layer 3. That is, it is possible to adjust the fluidity of the adhesive layer 3. Moreover, the press plate 21 in the plate member 30 is heated by the heater 22. By this, the adhesive layer 3 is heated.

Here, in the pressing step, it is more preferable that the adhesive layer 3 be heated such that dynamic viscosity thereof at a frequency of 10 Hz is in a range of 1,000 Pa·s to 200,000 Pa·s. By applying a pressure force by the press plate 21 in the plate member 30, it is possible to make the adhesive layer 3 quickly flow between the substrate 1 and the support plate 2. In addition, it is possible to make the thickness of the laminate 10 uniform. That is, it is possible to quickly form the laminate 10 having a uniform thickness.

In addition, in the pressing step, it is preferable that the adhesive layer 3 be heated such that the temperature thereof is in a range of 40° C. to 300° C. Thus, even in a case where an adhesive having a high glass transition temperature is used in the formation of the adhesive layer 3, it is possible to impart suitable fluidity to the adhesive layer 3. Therefore, it is possible to form the laminate 10 having a uniform thickness using the adhesive layer 3 having a high glass transition temperature.

A pressure force applied onto the laminate 10 by the plate member 30 in the pressing step may be appropriately adjusted in consideration of the type, the thickness, and viscosity of the adhesive layer, the size of the laminate etc. More specifically, for example, in a case of a laminate with a diameter of 12 inches, it is preferable that a pressure force of 100 kg or more is applied to the laminate in the pressing step, and it is more preferable that a pressure force of 100 kg or more but 5000 kg or less is applied to the laminate in the pressing step. In the pressing step, the pressure force applied onto the laminate 10 by the plate member 30 may be adjusted so that the laminate 10 has an even thickness. Furthermore, when bonding the substrate 1 and the support plate 2 to each other, it is preferable to adjust the pressure force applied onto the laminate 10 so that the adhesive layer 3 spreads to an end of an outer peripheral portion of the laminate 10. This makes it possible to seal a step portion on the substrate 1 from the outside with use of the adhesive layer 3.

Transporting Step

The bonding method according to the embodiment includes, after the pressing step, a transporting step of transporting the laminate 10 which is bonded through the adhesive layer 3 to the pressure adjusting chamber 54 for performing the pressure adjusting step (FIG. 1E). By this, it is possible to perform the pressing step and the pressure adjusting step at different places.

FIG. 1D is a diagram illustrating a state in which the upper plate member 30a of the plate member 30 is moved to the top portion, and the pin 24 lifts the laminate 10. At this time, the pressure in the pressure adjusting chamber 54 is the same as that in the pressure chamber 51, and for example, the pressure in the pressure adjusting chamber 54 is adjusted to a vacuum condition.

First, in the transporting step, the laminate 10 to which a pressure force is applied by the pressure chamber 51 is transported to the superposition chamber 52 by the internal transportation unit 25 through the gate 41. Next, the laminate 10 is transferred out from the superposition chamber 52 to the first transportation unit track 53 by the first transportation unit 43 through the transferring window 42 (FIGS. 1E and 2). Then, the transferring window 42 in the superposition chamber 52 is closed.

Next, the laminate 10 is mounted on the stage 31 in the pressure adjusting chamber 54 through the transferring window (now shown) by the first transportation unit 43 and the transferring window is closed. After that, in the superposition chamber 52, a substrate on which an adhesive layer is formed for the next bonding and a support plate is introduced from the transferring window 42 by the first transportation unit 43, and the pressing step is performed.

Here, the pressure in the first transportation unit track 53 is adjusted to the same pressure as that in the superposition chamber 52 and the pressure adjusting chamber 54. For this reason, the pressure in the superposition chamber 52 and the pressure adjusting chamber 54 at the time when the laminate 10, the substrate, and the support plate are transported are maintained at the same conditions. Therefore, it is possible to quickly press the next laminate without changing the pressure in the superposition chamber 52 and the pressure chamber 51. In addition, it is possible to perform the pressure adjusting step on the laminate 10 transported to the pressure adjusting chamber 54 in advance, during the pressing step. That is, by performing the pressing step and the pressure adjusting step at the same time, it is possible to effectively form a large number of laminates.

Pressure Adjusting Step

In the bonding method according to the embodiment, the pressure adjusting step (FIG. 1F) of placing the laminate 10 in the environment having higher pressure than the pressure of the environment in which the pressing step is performed is carried out.

According to the above configuration, the laminate 10 obtained by bonding the substrate 1 and the support plate 2 to each other through the adhesive layer 3 is pressed by the plate member 30, and in the pressure adjusting step, pressure is applied such that the support plate 2 follows a step portion of the substrate 1. Therefore, it is possible to make the adhesive layer 3 uniformly flow into the step portion of the substrate 1. Accordingly, the adhesive layer can be sufficiently embedded into the step portion of the substrate 1, and occurrence of the bonding defect can be prevented. In addition, it is possible to more efficiently embed the adhesive layer 3 into the step portion of the substrate 1 compared to the case of entirely pressing the laminate 10 by the pressing unit. Therefore, it is possible to quickly bond the substrate 1 and the support plate 2 to each other through the adhesive layer 3 while preventing the bonding defect.

FIG. 1F is a diagram illustrating a state in which the laminate 10 is mounted on the stage 31 in the pressure adjusting chamber 54. Here, the heater 22 is provided to the stage 31. By this configuration, the laminate 10 can be heated. In addition, the pressure in the pressure adjusting chamber 54 is adjusted to be in a range of 0.1 Pa to 5 kPa, which is the pressure of the environment in which the pressing step is performed in the pressure chamber 51.

In the pressure adjusting step, the pressure in the pressure adjusting chamber 54 is set in the environment having higher pressure than the pressure of the environment in which the pressing step is performed. Here, in the embodiment, a pressure difference between the pressure of the environment in which the substrate 1 and the support plate 2 are placed in the pressure adjusting step and the pressure of the environment in which the pressing step is performed is preferably in a range of 100 Pa to 500 kPa, more preferably in a range of 1 kPa to 500 kPa, and most preferably in a range of 10 kPa to 500 kPa.
When the pressure difference between the pressure of the environment in which the substrate 1 and the support plate 2 are placed in the pressure adjusting step and the pressure of the environment in which the pressing step is performed is in a range of 100 Pa to 500 kPa, the pressure is suitably applied such that the support plate 2 follows a step portion of the substrate 1. For this reason, it is possible to sufficiently embed the adhesive layer 3 into the step portion of the substrate 1.

Furthermore, by sealing the step portion on the end of the substrate 1 from the outside with use of the adhesive layer 3 in the pressing step, the adhesive layer 3 is pressed toward the step portion also at the end of the substrate 1 by increasing the pressure of the environment in which the laminate 10 is placed in the pressure adjusting step. Therefore, it is possible to sufficiently embed the adhesive layer 3 into the step portion on the end of the substrate 1.

In addition, in the pressure adjusting step included in the bonding method according to the embodiment, the pressure of the environment in which the substrate 1 and the support plate 2 are placed in the pressure adjusting step is preferably atmospheric pressure. By removing the vacuum conditions of the pressure adjusting chamber 54, the pressure in the pressure adjusting chamber 54 is adjusted to atmospheric pressure. That is, by adjusting the pressure in the pressure adjusting chamber 54 to atmospheric pressure, it is possible to simply place the laminate 10 in an environment having higher pressure than the pressure of the environment in which the pressing step is performed.

In addition, in the pressure adjusting step included in the embodiment, the substrate 1 and the support plate 2 bonded to each other through the adhesive layer 3 are heated. By this, even in the pressure adjusting step, it is possible to adjust the viscosity of the adhesive used in the adhesive layer 3 and improve the fluidity of the adhesive layer 3. For this reason, it is possible to more quickly embed the adhesive layer 3 into the step portion of the substrate 1 in the laminate 10.

Here, in the pressure adjusting step included in the embodiment, the adhesive layer 3 is heated such that the dynamic viscosity thereof at a frequency of 10 Hz is preferably in a range of 1,000 Pa·s to 200,000 Pa·s, more preferably in a range of 1,000 Pa·s to 100,000 Pa·s, and most preferably in a range of 1,000 Pa·s to 50,000 Pa·s. By heating the adhesive layer 3 such that dynamic viscosity thereof at a frequency of 10 Hz is in a range of 1,000 Pa·s to 200,000 Pa·s, it is possible to impart more suitable fluidity to the adhesive layer 3. Thus, in the pressure adjusting step, by pressing such that the support plate 2 follows a step portion of the substrate 1 by the pressure, it is possible to make the adhesive layer 3 quickly flow such that the step portion of the substrate 1 is embedded. In addition, even in a case of an adhesive layer having a high glass transition temperature, it is possible to impart fluidity. Therefore, it is possible to quickly bond the substrate 1 and the support plate 2 to each other through the adhesive layer 3 having a high glass transition temperature while preventing the bonding defect.

In addition, in the pressure adjusting step included in the embodiment, the adhesive layer 3 is heated such that the temperature thereof is preferably in a range of 40° C. to 300° C., more preferably in a range of 80° C. to 280° C., and most preferably in a range of 120° C. to 260° C. By heating the adhesive layer 3 such that the temperature thereof is in a range of 40° C. to 300° C. in the pressure adjusting step, it is possible to adjust the viscosity of the adhesive layer 3 having a high glass transition temperature to be in a range of 1,000 Pa·s to 200,000 Pa·s. Thus, it is possible to impart suitable fluidity to the adhesive layer 3. Therefore, it is possible to embed the adhesive layer 3 having a high glass transition temperature into the step portion of the substrate 1.

Here, the laminate 10 equipped with the adhesive layer 3 having a high glass transition temperature has high heat resistance. Thus, it is possible to prevent the substrate 1 and the support plate 2 from being separated by heat when performing a desired treatment to the substrate 1. That is, according to the bonding method in the embodiment (the first embodiment), it is possible to not only quickly form the laminate 10 while preventing the bonding defect but also quickly form a laminate having high heat resistance while preventing the bonding defect.

Other Steps

After the pressure adjusting step is performed, the laminate 10 is transferred out from the pressure adjusting chamber 54 by the first transportation unit 43. Subsequently, the laminate 10 is cooled in the cooling portion 66. Thereafter, the laminate 10 is transferred to the carrier station 60 by the first transportation unit 43. Moreover, as an arbitrary step, after cooling the laminate 10, the thickness of the laminate 10 is measured by the thickness distribution measuring device 67, and quality management and detection of an abnormality may be performed.

Modified Example 1

The bonding method according to the embodiment (the first embodiment) is not limited to the above embodiment.

For example, an embodiment in which the transporting step is not performed can be exemplified as a Modified Example 1.

In the bonding method according to Modified Example 1, after the pressing step is performed (FIGS. 1A to 1C), the pressure adjusting step is performed in the pressure chamber 51 in which the laminate 10 is formed (FIG. 1G).

Moreover, as shown in FIGS. 1A to 1C, in the bonding method according to Modified Example 1, the pressing step may be performed under the same conditions as those in the bonding method according to the first embodiment. After that, the pressure adjusting step is performed in the pressure chamber 51.

First, a bonding apparatus moves the upper plate member 30a in the plate member 30 to the top portion, and pressing of the laminate 10 is ended (FIG. 1D). Next, the laminate 10 is mounted on the lower plate member 30b. Here, the pressure in the pressure chamber 51 is maintained at the pressure at the time of performing the pressing step. In addition, the lower plate member 30b is heated by the heater 22. After that, in the pressure chamber 51, the pressure adjusting step is performed (FIG. 1G). Moreover, the conditions such as a pressure condition and a heating condition in the pressure adjusting step may be the same as those in the pressure adjusting step in the first embodiment.

Moreover, as an example, the pressure adjusting step may be performed in the superposition chamber 52 of the bonding unit 50.

Second Embodiment

The bonding method according to another embodiment (the second embodiment) of the present invention will be described with reference to FIGS. 1A to 1G. Moreover, for convenience, the members having the same function as in the members described in the embodiment described above are given like reference numerals, and their description are not repeated here.

In the embodiment, while maintaining the pressure of the environment in which the pressing step is performed, a heating step of heating a laminate is performed after the pressing step.

As shown in FIGS. 1A to 1G, the bonding method according to the embodiment (the second embodiment) includes the pressing step (FIGS. 1A to 1C) of bonding the substrate 1 and the support plate (support) 2 for supporting the substrate 1 to each other through the adhesive layer 3 and pressing the bonded substrate and support plate using a plate member 30, and after the pressing step, the heating step (FIG. 1F) of heating the substrate 1 and the support plate 2 bonded through the adhesive layer 3.

According to the above configuration, after the laminate 10 obtained by bonding the substrate 1 and the support plate 2 to each other through the adhesive layer 3 is pressed using the plate member 30, fluidity of the adhesive layer 3 can be suitably maintained in the heating step. Therefore, it is possible to make the adhesive layer 3 uniformly flow into the step portion of the substrate 1. Accordingly, the adhesive layer 3 can be sufficiently embedded into the step portion of the substrate 1, and occurrence of the bonding defect can be prevented. In addition, it is possible to more efficiently embed the adhesive layer 3 into the step portion of the substrate 1 because the fluidity of the adhesive layer 3 is suitably maintained. Therefore, it is possible to quickly bond the substrate 1 and the support plate 2 to each other through the adhesive layer 3 while preventing the bonding defect.

In addition, the bonding method according to the embodiment includes, after the pressing step, a transporting step (FIG. 1E) of transporting the substrate 1 and the support plate 2 which are bonded to each other through the adhesive layer 3 to the pressure adjusting chamber (heating chamber) 54 for performing the heating step.

Moreover, as shown in FIGS. 1A to 1C, in the bonding method according to the embodiment, the pressing step is performed under the same conditions as those in the bonding method according to the first embodiment.

Thereafter, through the transporting step, the heating step is performed.

Transporting Step

The bonding method according to the embodiment includes, after the pressing step, the transporting step of transporting the laminate 10 obtained by bonding through the adhesive layer 3 to the pressure adjusting chamber (heating chamber) 54 for performing the heating step. By this, it is possible to perform the pressing step and the heating step at different places.

Moreover, the transporting step in the embodiment is a step of transporting the laminate 10 from the pressure chamber 51 to the pressure adjusting chamber (heating chamber) 54, and in the step, the same operation as that of the first embodiment is performed. By this, as the same as in the first embodiment, it is possible to perform the pressing step and the heating step at the same time.

Therefore, it is possible to efficiently form a large number of laminates.

Heating Step

As shown in FIG. 1F, the bonding method according to the embodiment includes the heating step, after the pressing step, of heating the laminate 10 obtained by bonding the substrate 1 and the support plate 2 to each other through the adhesive layer 3.

FIG. 1F is a diagram illustrating a state in which the laminate 10 is mounted on the stage 31 in the pressure adjusting chamber (heating chamber) 54. Moreover, in the heating step, the pressure adjusting chamber 54 in the first embodiment is used as the heating chamber 54.

Here, the heater 22 is provided to the stage 31 in the heating chamber 54. By this configuration, the laminate 10 can be heated. In addition, the pressure in the heating chamber 54 is adjusted to be in a range of 0.1 Pa to 5 kPa, which is the pressure of the environment in which the pressing step is performed in the pressure chamber 51. Moreover, in the embodiment, the heating step is performed in a state in which the vacuum conditions in the pressing step are maintained.

Here, in the heating step included in the bonding method according to the embodiment, the adhesive layer 3 is heated such that the dynamic viscosity thereof at a frequency of 10 Hz is preferably in a range of 1,000 Pa·s to 200,000 Pa·s, more preferably in a range of 1,000 Pa·s to 100,000 Pa·s, and most preferably in a range of 1,000 Pa·s to 50,000 Pa·s. By heating the adhesive layer 3 such that the dynamic viscosity thereof at a frequency of 10 Hz is in a range of 1,000 Pa·s to 200,000 Pa·s, it is possible to impart more suitable fluidity to the adhesive layer 3. In addition, even in a case of an adhesive layer having a high glass transition temperature, it is possible to impart fluidity. Therefore, it is possible to quickly bond the substrate 1 and the support plate 2 to each other through the adhesive layer 3 having a high glass transition temperature while preventing the bonding defect.

In addition, in the heating step included in the embodiment, the adhesive layer 3 is heated such that the temperature thereof is preferably in a range of 40° C. to 300° C., more preferably in a range of 80° C. to 280° C., and most preferably in a range of 120° C. to 260° C. By heating the adhesive layer 3 such that the temperature thereof is in a range of 40° C. to 300° C. in the pressure adjusting step, it is possible to adjust the viscosity of the adhesive layer 3 having a high glass transition temperature to be in a range of 1,000 Pa·s to 200,000 Pa·s. Thus, it is possible to impart suitable fluidity to the adhesive layer 3. Therefore, it is possible to embed the adhesive layer 3 having a high glass transition temperature into the step portion of the substrate 1.

Here, the laminate 10 equipped with the adhesive layer 3 having a high glass transition temperature has high heat resistance. Thus, it is possible to prevent the substrate 1 and the support plate 2 from being separated by heat when performing a desired treatment to the substrate 1. That is, according to the bonding method in the embodiment (the second embodiment), it is possible to not only quickly form the laminate 10 while preventing the bonding defect but also quickly form a laminate having high heat resistance while preventing the bonding defect.

Moreover, in the heating step included in the bonding method according to the embodiment, if the pressure is adjusted such that the laminate 10 is placed in the environment having higher pressure than the pressure of the environment in which the pressing step is performed, it goes without saying that the method becomes the same as the bonding method according to the first embodiment.

Modified Example 2

The bonding method according to the embodiment (the second embodiment) is not limited to the above embodiment. For example, an embodiment in which the transporting step is not performed can be exemplified as Modified Example 2.

In the bonding method according to Modified Example 2, after the pressing step is performed (FIGS. 1A to 1C), the heating step is performed in the pressure chamber 51 in which the laminate 10 is formed (FIG. 1G).

Moreover, as shown in FIGS. 1A to 1C, in the bonding method according to Modified Example 2, the pressing step may be performed under the same conditions as those in the bonding method according to the first embodiment. After that, the heating step is performed in the pressure chamber 51.

First, a bonding apparatus moves the upper plate member 30a in the plate member 30 to the top portion, and pressing of the laminate 10 is ended (FIG. 1D). Next, the laminate 10 is mounted on the lower plate member 30b. Here, the pressure in the pressure chamber 51 is maintained at the pressure at the time of performing the pressing step. In addition, the lower plate member 30b is heated by the heater 22. After that, in the pressure chamber 51, the heating step is performed (FIG. 1G). Moreover, the conditions such as a pressure condition and a heating condition in the heating step may be the same as those in the second embodiment.

In the specification, the following invention is also described.

The bonding method according to an embodiment of the present invention includes the pressing step of bonding the substrate and the support for supporting the substrate to each other through an adhesive layer and pressing the bonded substrate and support using the pressing unit, and, after the pressing step, the heating step of heating the substrate and the support bonded through the adhesive layer.

According to the above configuration, after the laminate obtained by bonding a substrate and a support to each other through an adhesive layer is pressed using the pressing unit, fluidity of the adhesive layer can be suitably maintained in the heating step. Therefore, it is possible to make the adhesive composition uniformly flow into the step portion of the substrate. Accordingly, the adhesive layer can be sufficiently embedded into the step portion of the substrate, and occurrence of the bonding defect can be prevented. In addition, it is possible to more efficiently embed the adhesive layer into the step portion of the substrate because the fluidity of the adhesive layer is suitably maintained. Therefore, it is possible to quickly bond the substrate and the support to each other through the adhesive layer while preventing the bonding defect.

In the heating step included in the bonding method according to an embodiment of the present invention, it is preferable that the adhesive layer be heated such that dynamic viscosity thereof at a frequency of 10 Hz is in a range of 1,000 Pa·s to 200,000 Pa·s.

According to the above configuration, it is possible to impart more suitable fluidity to the adhesive layer. Therefore, it is possible to make the adhesive layer quickly flow such that the step difference of the substrate is embedded. In addition, even in a case of an adhesive layer having a high glass transition temperature, it is possible to impart fluidity. Therefore, it is possible to quickly bond the substrate and the support to each other through the adhesive layer having a high glass transition temperature while preventing the bonding defect.

In the heating step included in the bonding method according to an embodiment of the present invention, it is preferable that the adhesive layer be heated such that the temperature thereof is in a range of 40° C. to 300° C.

According to the above configuration, it is possible to adjust the viscosity of the adhesive layer having a high glass transition temperature to be in a range of 1,000 Pa·s to 200,000 Pa·s. Thus, it is possible to impart suitable fluidity to the adhesive layer. Therefore, it is possible to embed the adhesive layer having a high glass transition temperature into the step portion of the substrate.

In the heating step included in the bonding method according to an embodiment of the present invention, the substrate and the support bonded to each other through the adhesive layer may be placed in an environment having higher pressure than the pressure of the environment in which the pressing step is performed.

According to the above configuration, a laminate obtained by bonding a substrate and a support to each other through an adhesive layer is pressed by pressure such that the support follows the step portion of the substrate. Therefore, it is possible to make the adhesive layer uniformly flow into the step difference of the substrate. For this reason, it is possible to sufficiently embed the adhesive layer into the step portion of the substrate.

In the bonding method according to an embodiment of the present invention, in the heating step, a pressure difference between the pressure of the environment in which the substrate and the support are placed and the pressure of the environment in which the pressing step is performed is preferably in a range of 100 Pa to 500 kPa.

According to the above configuration, in the heating step, the laminate is suitably pressed by pressure such that the support follows the step portion of the substrate. For this reason, it is possible to sufficiently embed the adhesive layer into the step portion of the substrate.

In the bonding method according to an embodiment of the present invention, the pressure of the environment in which the pressing step is performed is preferably in a range of 0.1 Pa to 5 kPa.

According to the above configuration, it is possible to bond a substrate and a support to each other through an adhesive layer while preventing the adhesive layer from foaming.

In the bonding method according to an embodiment of the present invention, in the heating step, the pressure of the environment in which the substrate and the support are placed is preferably the atmospheric pressure.

According to the above configuration, by removing the vacuum conditions of the heating chamber, the pressure in the heating chamber is adjusted to atmospheric pressure. That is, by adjusting the pressure in the heating chamber to atmospheric pressure, it is possible to simply place the laminate in an environment having higher pressure than the pressure of the environment in which the pressing step is performed.

The bonding method according to an embodiment of the present invention preferably includes, after the pressing step, the transporting step of transporting the substrate and the support bonded to each other through the adhesive layer in the heating chamber in which the heating step is performed.

According to the above configuration, by performing the pressing step and the heating step at the same time, it is possible to effectively form a large number of laminates.

The present invention is not limited to each embodiment described above, and may be varyingly altered within the scope of the claims. That is, an embodiment derived from a proper combination of technical means disclosed in different embodiments is included in the technical scope of the present invention.

Examples

Preparation of Adhesive Composition

First, adhesive compositions A to D used in Examples 1 to 12 and Comparative Examples 1 to 6 were prepared. A resin, an additive, a main solvent, and an entrainer used in each adhesive composition are shown in Table 1.

Resins used in the adhesive compositions A to D were APEL 8008T (cycloolefin copolymer; copolymer of ethylene-tetracyclododecene, Mw=100,000, Mw/Mn=2.1, ethylene:cyclododecene=80:20 (molar ratio)) of APEL (product name) manufactured by Mitsui Chemicals, Inc., Septon V9827 (SEBS: styrene-ethylene-butylene-styrene block copolymer of which styrene block is a reaction crosslinking type) and Septon 2002 (SEPS: styrene-isoprene-styrene block) of Septon (product name) manufactured by KURARAY Co., Ltd., TOPAS (product name) TM (cycloolefin copolymer; copolymer of ethylene-norbornene, Mw=10,000, Mw/Mn=2.08, norbornene:ethylene=50:50 (weight ratio)) manufactured by POLYPLASTICS Co., Ltd., and Tuftec (product name) H1051 (SEBS; hydrogenated styrene-based thermoplastic elastomer; styrene content of 42%, Mw=78,000) manufactured by Asahi Kasei Corporation.

Furthermore, in the adhesive compositions B to D, as an acrylic resin, A2 (Mw=10,000) was used.

A2 is a random polymer having the following structure (in the formula, l/m/n=60/20/20 (weight ratio)).

[Chemical formula 2]

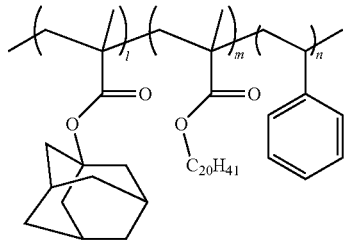

In addition, as a thermal polymerization inhibitor (additive), "IRGANOX (product name) 1010" manufactured by BASF Corp. was used. In addition, as a main solvent, decahydronaphthalene was used. In addition, as an entrainer, butyl acetate was used.

First, using the resin, the additive, the main solvent, and the entrainer described above, the adhesive composition A was prepared. Specifically, 100 parts by weight of APEL 8008T (manufactured by Mitsui Chemicals, Inc.) was dissolved to be a concentration of 25% by weight in a solvent in which 15 parts by weight of butyl acetate was mixed with 100 parts by weight of decahydronaphthalene, and 1 part by weight of IRGANOX as an additive and 15 parts by weight of butyl acetate as an entrainer were added thereto, whereby the adhesive composition A was prepared. In addition, using the resin, the additive, the main solvent, and the entrainer described above, the adhesive compositions B to D were prepared. The composition ratios of the adhesive compositions A to D are shown in the following Table 1.

TABLE 1

|  | Adhesive composition A | Adhesive composition B | Adhesive composition C | Adhesive composition D |
|---|---|---|---|---|
| Resin (Resin component) | APEL 8008T (100%) | Septon V9827 (50%) Septon 2002 (20%) A2 (30%) | Septon V9827 (70%) TOPAS-TM (20%) A2 (10%) | H1051 (50%) Septon 2002 (40%) A2 (10%) |
| Polymerization inhibitor with respect to 100 parts of resin | 1 part of IRGANOX 1010 | 1 part of IRGANOX 1010 | 1 part of IRGANOX 1010 | 1 part of IRGANOX 1010 |
| Main solvent | Decahydronaphthalene | Decahydronaphthalene | Decahydronaphthalene | Decahydronaphthalene |

TABLE 1-continued

|  | Adhesive composition A | Adhesive composition B | Adhesive composition C | Adhesive composition D |
| --- | --- | --- | --- | --- |
| Entrainer with respect to 100 parts of main solvent | 15 parts of butyl acetate | 15 parts of butyl acetate | 15 parts of butyl acetate | 15 parts of butyl acetate |

Measurement of Dynamic Viscosity

While heating adhesive layers formed using the adhesive layers A to D, dynamic viscosity was measured, and a relationship between the dynamic viscosity and temperature of each adhesive layer was obtained.

The prepared adhesive compositions A to D were coated on a PET film treated with a release agent, and the resultant products were baked at 100° C. and 160° C. for 60 minutes respectively, in an oven under atmospheric pressure, whereby adhesive layers were formed. Next, the dynamic viscosity ($\eta^*$) of the each adhesive layer peeled off from the PET film was measured using a dynamic viscosity measuring device (Reogel-E4000, manufactured by UBM). The dynamic viscosity was measured under the conditions that the temperature is raised at a rate of 5° C./min from 150° C. to 275° C. using a sample having a shape of which a thickness is 0.5 mm and a height and width are 20 mm respectively, and slit shear, under a shear condition of a frequency of 10 Hz. The relationship between the dynamic viscosity and temperature of each adhesive layer formed using the adhesive compositions A to D is as shown in FIG. 3.

Figure 3:
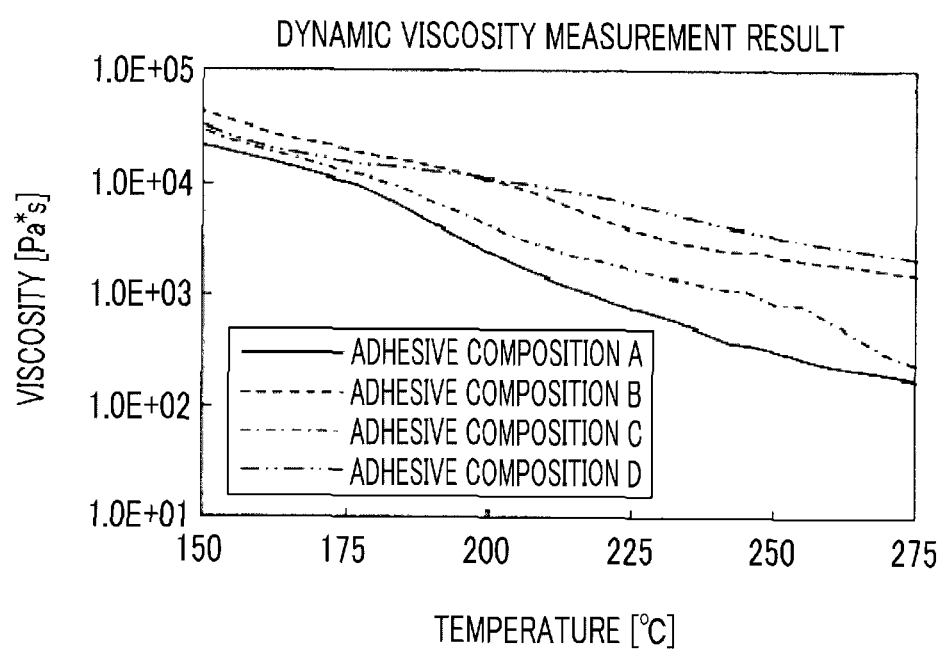
FIG. 3 is a graph showing a relationship between dynamic viscosity and temperature of an adhesive composition used in the bonding method according to one embodiment of the present invention.

As shown in FIG. 3, the adhesive layers formed using the adhesive compositions A to D showed a tendency that the dynamic viscosity becomes a lower value than 10,000 Pa·s by being heated to 177° C. to 207° C. Here, the temperatures of the adhesive compositions A to D when the dynamic viscosity is 10,000 Pa·s are as shown in the following Table 2.

TABLE 2

|  | Adhesive composition A | Adhesive composition B | Adhesive composition C | Adhesive composition D |
| --- | --- | --- | --- | --- |
| Temperature [° C.] of adhesive composition at the time when dynamic viscosity $\eta^*$ is 10,000 Pa · s | 177 | 185 | 200 | 207 |

Based on the result of the temperatures of the adhesive compositions A to D when the dynamic viscosity is 10,000 Pa·s shown in Table 2, the temperature at the time of pressing each adhesive composition and the temperature at the time of baking at atmospheric pressure were set, and the following bonding evaluation was performed.

Bonding Evaluation

Laminates of Examples 1 to 12 and laminates of Comparative Examples 1 to 6 were prepared under the conditions shown in Table 3 below, and the presence of the bonding defect in each laminate was evaluated.

(Preparation of Laminates of Examples 1-7)

In Examples 1-7, a laminate was prepared using a bare silicon as a substrate.

First, a laminate of Example 1 was prepared in accordance with a procedure below.

The adhesive composition A was spin-coated onto a semiconductor wafer substrate (12 inches, bare silicon, and baked at the temperatures of 90° C., 160° C., and 220° C. for 4 minutes respectively, whereby an adhesive layer was formed (film thickness of 50 μm).

Subsequently, while rotating the semiconductor wafer substrate, by supplying TZNR (registered trademark) HC thinner (manufactured by Tokyo Ohka Kogyo Co., LTD.) at a supply rate of 20 cc/min with an EBR nozzle, a portion of the adhesive layer outside the edge bead (raised portion of the adhesive layer of the wafer peripheral portion) on the semiconductor wafer substrate was removed. Thus, the adhesive layer was adjusted beforehand so that when the semiconductor wafer substrate and the bare glass support were bonded to each other through the adhesive layer, the adhesive layer would spread to the end of the outer peripheral portion of the substrate and would not protrude.

Thereafter, a bare glass support (12 inches) and the wafer substrate were bonded to each other in vacuum (<10 Pa) under the conditions that the pressing temperature is 180° C. and the pressure force is 1000 kg for 60 seconds, whereby a laminate was prepared (pressing step). Then, by opening the pressure chamber, the vacuum conditions were removed, and as a result, the atmospheric pressure was achieved, and then, the laminate was baked at 180° C. for 120 seconds (pressure adjusting step).

Moreover, the column of chamber in the pressure adjusting step in Table 3 shows that in which chamber, the superposition chamber 52 or the pressure adjusting chamber 54 in FIG. 2, the pressure adjusting step was performed.

Thereafter, in accordance with the same procedure as that for Example 1, laminates of Examples 2-7 were prepared under the conditions shown in Table 3.

(Preparation of laminates of Examples 8-10) In each of Examples 8-10, a laminate was prepared using a silicon substrate on which a step portion was formed due to a circuit (pattern) (hereinafter "stepped substrate") and an adhesive composition shown in Table 1 as the adhesive layer. The substrate had, as the step portion, a lattice-shaped concave portion of 1 mm in line width, and a cylindrical convex portion of 0.2 mm in diameter which was provided inside a portion surrounded by the lattice-shaped concave portion. A height of the step portion on the substrate was 20 μm.

Initially, the laminate of Example 8 was prepared in accordance with the following procedure. In Example 8, an adhesive composition B was spin-coated onto a bare glass support (12 inches) and baked at 90° C., 160° C., and 220° C. each for 4 minutes, so that an adhesive layer was formed (film thickness of 50 μm).

Subsequently, while rotating the glass support, by supplying TZNR (registered trademark) HC thinner (manufactured by Tokyo Ohka Kogyo Co., LTD.) at a supply rate of 20 cc/min with an EBR nozzle, a portion of the adhesive layer outside the edge bead on the glass support was removed. Thus, the adhesive layer was adjusted similarly with Example 1.

Thereafter, the stepped substrate and the glass support were bonded to each other in such a manner that a surface of the substrate on which surface the step portion was formed contacted the adhesive layer, and the pressing step and the pressure adjusting step were carried out under the conditions shown in Table 3.

Thereafter, in accordance with the same procedure as that for Example 8, laminates of Examples 9 and 10 were prepared under the conditions shown in Table 3.

(Preparation of Laminates of Examples 11 and 12)

In Examples 11 and 12, an adhesive layer was formed with use of an adhesive film, and a laminate was prepared with use of the stepped substrate.

Initially, viscosity of the adhesive composition B at 25° C. in Table 1 was adjusted to be 10,000 cP with use of a main solvent etc. The adhesive composition B whose viscosity had been adjusted was applied to a PET film (product name: Lumirror S10 (of 100 μm in thickness) manufactured by Toray Industries, Inc.) (base film) with use of a coating device (CAG-750, manufactured by LABO co., ltd.) through wet coating (slot die) which is a roll-to-roll method at coating speed of 1 m/min with a width of 500 mm. Thereafter, the film was caused to pass through a drying furnace at 150° C. and made dried, so that an adhesive film B having an adhesive layer of 50 μm in thickness was obtained. Next, a polyethylene protective film (cover film) was superimposed on an exposed surface of the adhesive layer and the film was rolled so that the adhesive film was in a roll shape which was easy to store. Similarly, using an adhesive composition D shown in Table 1, an adhesive film D having an adhesive layer of 50 μm in thickness was obtained and was made in a roll shape.

Next, in accordance with the following procedure, the laminate of Example 11 was prepared. In Example 11, a surface of the adhesive film B from which surface the cover film had been peeled off was superimposed on a bare glass support, and the adhesive layer was laminated with use of a laminator under conditions of 100° C., 0.2 MPa, and 0.5 m/min. Subsequently, the base film was peeled off, so that the adhesive layer of 50 μm in film thickness was formed on the glass support. Then, the stepped substrate similar to those in Examples 8 and 9 and the glass support were bonded to each other in such a manner that the surface of the stepped substrate, on which surface a step portion was formed, contacted the adhesive layer. Thereafter, the pressing step and the pressure adjusting step were carried out under conditions shown in Table 3.

Thereafter, the laminate of Example 12 was prepared in accordance with the same procedure as that for Example 11 under the conditions shown in Table 3. In Example 12, the laminate was prepared using the adhesive film D.

(Evaluation of Examples)

The laminates of Examples 1-12 were subjected to a thinning (50 μm) treatment by a back grinding device (manufactured by DISCO Corporation) so that back surfaces of the respective wafer substrates were thinned. Then, the laminates were subjected to a vacuum heating treatment at 220° C. for 10 minutes. It was evaluated whether foaming was made in the adhesive layer (whether foam is generated in the adhesive layer). The result of evaluation is shown in Table 3 below.

TABLE 3

|  |  |  | Example 1 | Example 2 | Example 3 | Example 4 | Example 5 | Example 6 | Example 7 |
|---|---|---|---|---|---|---|---|---|---|
|  |  |  | Resin (Resin component) | | | | | | |
|  |  |  | Adhesive composition A | Adhesive composition B | Adhesive composition C | Adhesive composition D | Adhesive composition A | Adhesive composition B | Adhesive composition C |
| Bonding condition (12 inches) | Pressing step | Temperature | 180° C. | | | 215° C. | | 180° C. | 215° C. |
|  |  | Pressure | | | | <10 Pa | | | |
|  |  | Pressure force | | | | 1000 kg | | | |
|  |  | Time | | | | 60 seconds | | | |
|  | Pressure adjusting step | Temperature | 180° C. | 190° C. | 200° C. | 220° C. | 220° C. | 220° C. | 220° C. |
|  |  | Pressure | | | | Atmospheric pressure | | | |
|  |  | Time | | | | 120 seconds | | | |
|  |  | Chamber | 52 | 54 | 52 | 52 | 52 | 52 | 52 |
| Bonding evaluation |  |  | Excellent | Excellent | Excellent | Excellent | Excellent | Excellent | Excellent |

|  | Example 8 | Example 9 | Example 10 | Example 11 | Example 12 |
|---|---|---|---|---|---|
|  | Substrate (12 inch wafer) | | | | |
|  | Step portion | Step portion | Step portion | Step portion | Step portion |
|  | Resin (resin component) | | | | |
|  | Adhesive compo- | Adhesive compo- | Adhesive compo- | Adhesive | Adhesive |

TABLE 3-continued

|  |  |  | sition B | sition B | sition D | film B | film D |
|---|---|---|---|---|---|---|---|
| Film thickness of resin (film) |  |  | 50 μm | 50 μm | 50 μm | 50 μm | 50 μm |
| Bonding condition (12 inches) | Pressing step | Temperature |  |  | 215° C. |  |  |
|  |  | Pressure |  |  | <10 Pa |  |  |
|  |  | Pressure force |  |  | 1000 kg |  |  |
|  |  | Time |  |  | 60 seconds |  |  |
|  | Pressure adjusting step | Temperature | 200° C. | 220° C. | 220° C. | 220° C. | 220° C. |
|  |  | Pressure |  |  | Atmospheric pressure |  |  |
|  |  | Time |  |  | 120 seconds |  |  |
|  |  | Chamber | 52 or 54 | 52 or 54 | 52 or 54 | 52 or 54 | 52 or 54 |
| Bonding evaluation |  |  | Excellent | Excellent | Excellent | Excellent | Excellent |

As shown in Table 3, it was confirmed that in the laminates of Examples 1 to 12 on which baking at atmospheric pressure (pressure adjusting step) was performed, the occurrence of fine bonding defects can be prevented by performing baking at atmospheric pressure (Excellent). In Examples 1-10 among the aforementioned Examples, it was confirmed that in both of a case where the bare silicon was used as the substrate and a case where the silicon on which a step portion was formed was used as the substrate, the substrate was coated with the adhesive layer to the end of the substrate, and no bonding defects occurred. Also in Examples 11 and 12 among the aforementioned Examples, it was confirmed that no fine bonding defects occurred at an inside of a peripheral portion of the substrate, and occurrence of bonding defects can be prevented sufficiently.

In addition, as shown in Table 3, it was confirmed that in the laminates of Examples 1 to 12, in both of a case of performing the pressure adjusting step in the superposition chamber 52 and a case of performing the pressure adjusting step in the pressure adjusting chamber 54 after the transferring-out step, the occurrence of fine bonding defects can be prevented. In addition, it was confirmed that in the laminates of Examples 1 to 12, even in a case where the rear surface of the wafer substrate was subjected to a thinning treatment by a back grinding device and then a vacuum heat treatment was performed at 220° C. for 10 minutes, foam is not generated in the adhesive layer.

(Comparative Examples 1-6)

Next, laminates of Comparative Examples 1 to 6 which were not subjected to the pressure adjusting step were prepared using the adhesive compositions A to D under the following conditions, and the presence of the bonding defect in each laminate was evaluated. Moreover, in Comparative Examples 1 to 6, the adhesive layers were formed in the same conditions as in Examples 1 to 10. The conditions of the pressing step and the like are as shown in the following Table 4. In addition, the evaluation result for the presence of the bonding defect is also shown in Table 4.

TABLE 4

|  |  |  | Comparative Example 1 | Comparative Example 2 | Comparative Example 3 | Comparative Example 4 | Comparative Example 5 | Comparative Example 6 |
|---|---|---|---|---|---|---|---|---|
|  |  |  | Resin (Resin component) | | | | | |
|  |  |  | Adhesive composition A | Adhesive composition B | Adhesive composition C | Adhesive composition D | Adhesive composition B | Adhesive composition D |
| Bonding condition (12 inches) | Pressing step | Temperature | 180° C. |  | 215° C. |  | 215° C. |  |
|  |  | Pressure |  |  | <10 Pa |  |  |  |
|  |  | Pressure force |  |  | 1000 kg |  |  |  |
|  |  | Time |  |  | 60 seconds |  |  |  |
|  | Pressure adjusting step |  |  |  | None |  |  |  |
| Bonding evaluation |  |  | Poor | Poor | Poor | Poor | Poor | Poor |

As shown in Table 4, in Comparative Examples 1 to 6 in which baking at atmospheric pressure was not performed, the bonding defect was generated between a bare glass support of 12 inches and the adhesive layer regardless of the type of the substrate (Poor).

Figure 4A:
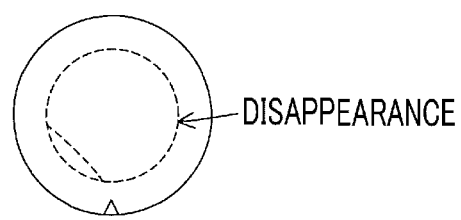
FIGS. 4A and 4B are diagrams illustrating states of laminates after bonding of the laminate according to Example 4 and the laminate according to Comparative Example 4.

The states of the laminates in Example 4 and Comparative Example 4 will be described using FIGS. 4A and 4B. FIG. 4A is a diagram illustrating a state in a case where the laminate of Example 4 is viewed from the glass support side, and FIG. 4B is a diagram illustrating a state in a case where the laminate of Comparative Example 4 under the same conditions as those in Example 4 except that the pressure adjusting step is not performed is viewed from the glass support side.

Figure 4B:
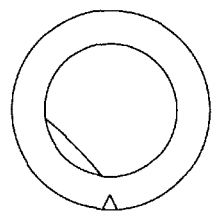

As shown in FIG. 4B, the bonding defect with fine foams was observed at the solid line shown on the inside of the glass support. It is considered that these fine foams were generated at a region where the adhesive layer is thick. In contrast, in the laminate of Example 4 which was subjected to the pressure adjusting step, fine foam was not observed, and bonding defect was not observed (FIG. 4A).

Therefore, from the above results, it could be confirmed that by performing the pressure adjusting step after the pressing step, it is possible to prevent the bonding defect between a substrate and a support plate in both of a case where the adhesive composition is used and a case where the adhesive film was used in order to form the adhesive layer.

The present invention can be widely used, for example, in a manufacturing step of a fine semiconductor device.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A bonding method, comprising:
   bonding a substrate and a support for supporting the substrate to each other through an adhesive layer and pressing the bonded substrate and support, wherein an environment in which the pressing is performed has a pressure of 0.1 Pa to 10 Pa and a temperature of 120 to 260° C., wherein the adhesive layer comprises a cycloolefin copolymer or an elastomer resin component, a polymerization inhibitor, a solvent and an entrainer;
   after bonding and pressing, placing the bonded substrate and support in an environment at atmospheric pressure and a temperature of 120 to 260° C.; and
   after placing the bonded substrate and support, vacuum heating the bonded substrate and support at a pressure of 0.1 to 10 Pa and a temperature of 120 to 260° C.

2. The bonding method according to claim 1, wherein in the placing of the bonded substrate and support, the adhesive layer is heated such that the dynamic viscosity thereof at a frequency of 10 Hz is in a range of 1,000 Pa·s to 200,000 Pa·s.

3. The bonding method according to claim 1, wherein in the placing of the bonded substrate and support, the adhesive layer is heated such that the temperature thereof is in a range of 180 to 215° C.

4. The bonding method according to claim 1, further comprising:
   after the bonding and pressing, transporting the bonded substrate and support to a pressure adjusting chamber where the bonded substrate and support are placed.

5. The bonding method according to claim 1, further comprising:
   after the placing of the bonded substrate and support and before the vacuum heating, thinning the substrate.

6. The bonding method according to claim 1, wherein in the vacuum heating, the bonded substrate and support are heated at a temperature of 220° C.

7. The bonding method according to claim 1, wherein the support is made of glass.

8. The bonding method according to claim 1, wherein placing the bonded substrate and support is in an environment at atmospheric pressure and a temperature of 180° C. to 220° C.

* * * * *